(12) United States Patent
Sakui et al.

(10) Patent No.: US 6,295,227 B1
(45) Date of Patent: Sep. 25, 2001

(54) NON-VOLATILE SEMICONDUCTOR MEMORY DEVICE

(75) Inventors: Koji Sakui, Setagaya-Ku; Hiroshi Nakamura, Kawasaki, both of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/449,932

(22) Filed: Nov. 24, 1999

(30) Foreign Application Priority Data

Nov. 26, 1998 (JP) .................................................. 10-336162
Sep. 20, 1999 (JP) .................................................. 11-266176

(51) Int. Cl.$^7$ .................................................. G11C 16/04
(52) U.S. Cl. ........................ 365/185.17; 365/185.05; 365/185.11; 365/185.23; 365/185.29
(58) Field of Search ...................... 365/185.17, 185.05, 365/185.11, 185.23, 185.26, 185.29

(56) References Cited

U.S. PATENT DOCUMENTS 5,841,721 * 11/1998 Kwon et al. ........................ 365/218
5,898,615 * 4/1999 Chida .............................. 365/185.17

OTHER PUBLICATIONS

IEEE Journal of Solid–State Circuits, "A 3.3 V Mb NAND Flash Memory with Incremental Step Pulse Programming Scheme," vol. 30, pp. 1149–1156, Kang–Deog SUH, et al., Nov. 1995.

IEEE Journal of Solid–State Circuits, "A 35 ns Cycle Time 3.3 V Only 32 Mb NAND Flash EEPROM," vol. 30, pp. 1157–1164, Yoshihisa IWATA, et al., Nov. 1995.

* cited by examiner

*Primary Examiner*—David Nelms
*Assistant Examiner*—David Lam
(74) *Attorney, Agent, or Firm*—Banner & Witcoff, Ltd.

(57) ABSTRACT

There is provided a NAND type EEPROM capable of setting a plurality of erase blocks in a single NAND cell block. The NAND cell block of a memory cell array comprises a NAND cell comprising a plurality of memory cell transistors connected in series between a bit line and a source line. Between the bit line and source line of the NAND cell, a selecting transistor is provided. A block dividing selecting transistor is provided between adjacent two memory transistors in the NAND cell, so that the NAND cell block is divided into two memory cell units. One of these memory cell units is selected as an erase unit to carry out the batch erase of data every erase unit and the write of data every page.

25 Claims, 47 Drawing Sheets

CROSS SECTION TAKEN ALONG LINE A-A'

CROSS SECTION TAKEN ALONG LINE B-B'

[DATA ERASE]

| | POTENTIAL |
|---|---|
| SSL | $\alpha$ xVera FLOATING |
| UNSELECTED BLOCKS WL0~WL15 | $\alpha$ xVera FLOATING |
| STL | $\alpha$ xVera FLOATING |
| SELECTED BLOCKS WL16~WL31 | Vss |
| GSL | $\alpha$ xVera FLOATING |
| BL0,BL1 | Vera-Vf |
| SL | Vera-Vf |
| p-WELL | Vera |

[DATA WRITE]

| | POTENTIAL |
|---|---|
| SSL | Vread |
| UNSELECTED BLOCKS WL0~WL15 | Vread |
| STL | Vread |
| UNSELECTED WORD LINES IN SELECTED BLOCK WL16, WL18~WL31 | Vpass |
| SELECTED WORD LINE IN SELECTED BLOCK WL17 | Vpgm |
| GSL | Vss |
| "0" WRITTEN BIT LINE BL0 | Vss |
| "1" WRITTEN BIT LINE BL1 | Vcc |
| SL | Vcc |
| p-WELL | Vss |

FIG. 8

[DATA READ]

| | POTENTIAL |
|---|---|
| SSL | Vread |
| UNSELECTED BLOCKS WL0~WL15 | Vread |
| STL | Vread |
| UNSELECTED WORD LINES IN SELECTED BLOCK WL16~WL18, WL20~WL31 | Vread |
| SELECTED WORD LINE IN SELECTED BLOCK WL19 | Vss |
| GSL | Vread |
| "0" READ BIT LINE BL0 | Vbl→Vbl |
| "1" READ BIT LINE BL1 | Vbl→Vss |
| SL | Vss |
| p-WELL | Vss |

FIG. 10

[DATA ERASE]

| | POTENTIAL |
|---|---|
| SSL | $\alpha \times$Vera FLOATING |
| UNSELECTED BLOCKS WL0~WL7 WL8~WL15 WL24~WL31 | $\alpha \times$Vera FLOATING |
| STL0,STL1,STL2 | $\alpha \times$Vera FLOATING |
| GSL | $\alpha \times$Vera FLOATING |
| BL | Vera-Vf |
| SL | Vera-Vf |
| SELECTED BLOCKS WL16~WL23 | Vss |
| p-WELL | Vera |

FIG. 12

[DATA WRITE]

| | POTENTIAL |
|---|---|
| SSL | Vread |
| WORD LINES IN UNSELECTED BLOCK WL0~WL7 WL8~WL15 WL24~WL31 | Vread |
| STL0, STL1 | Vread |
| UNSELECTED WORD LINES IN SELECTED BLOCK WL16~WL18,WL20~WL23 | Vpass |
| SELECTED WORD LINE IN SELECTED BLOCK WL19 | Vpgm |
| STL2 | Vss |
| GSL | Vread |
| SL | Vcc |
| p-WELL | Vss |

FIG. 13

| | ERASE | READ | WRITE |
|---|---|---|---|
| SELECTED WL | 0 | 0 | Vpgm |
| UNSELECTED WL | F | Vread | Vpass |
| SSL | F | Vread | Vcc |
| GSL | F | Vread | 0 |
| "0"BL | F | 1.5 | 0 |
| "1"BL | F | 0.7 | Vcc |
| p-WELL | Vera | 0 | 0 |

NOTE : DURING ERASE OPERATION, SELECTED WL DENOTES WORD LINE IN SELECTED BLOCK, AND UNSELECTED WL DENOTES WORD LINE IN UNSELECTED BLOCK.

CROSS SECTION TAKEN ALONG LINE A-A'

CONVENTIONAL STRING ($4F^2+\alpha$)      ($8F^2+\alpha$)

AND STRING ($8F^2+\alpha$)

(a)      (b)      (c)

[DATA READ]

| | POTENTIAL |
|---|---|
| SSL | Vread |
| UNSELECTED BLOCKS WL0~WL15, WL24~WL31 | Vread |
| STL0,STL1,STL2 | Vread |
| UNSELECTED WORD LINES IN SELECTED BLOCK WL16~WL18, WL20~WL23 | Vread |
| SELECTED WORD LINE IN SELECTED BLOCK WL19 | Vss |
| GSL | Vread |
| "0" READ BIT LINE BL0 | Vbl→Vbl |
| "1" READ BIT LINE BL1 | Vbl→Vss |
| SL | Vss |
| p-WELL | Vss |

FIG. 25

[DATA ERASE]

| | POTENTIAL |
|---|---|
| SSL | $\alpha \times$Vera FLOATING |
| UNSELECTED BLOCKS<br>WL0~WL7<br>WL8~WL15<br>WL24~WL31 | $\alpha \times$Vera FLOATING |
| STL0,STL1,STL2 | $\alpha \times$Vera FLOATING |
| GSL | $\alpha \times$Vera FLOATING |
| BL | Vera-Vf |
| SL | Vera-Vf |
| SELECTED BLOCKS<br>WL16~WL23 | Vss |
| p-WELL | Vera |

FIG. 26

[DATA WRITE]

| | POTENTIAL |
|---|---|
| SSL | Vread |
| WORD LINES IN UNSELECTED BLOCK WL0~WL7 WL8~WL15 WL24~WL31 | Vread |
| STL0,STL1,STL2 | Vread |
| UNSELECTED WORD LINES IN SELECTED BLOCK WL16~WL18,WL20~WL23 | Vpass |
| SELECTED WORD LINE IN SELECTED BLOCK WL19 | Vpgm |
| GSL | Vss |
| SL | Vcc |
| p-WELL | Vss |

FIG. 27

[DATA READ]

| | POTENTIAL |
|---|---|
| SSL | Vread |
| UNSELECTED BLOCKS WL0~WL2,WL4~WL7 | Vread |
| STL0~STL6 | Vread |
| SELECTED WORD LINES IN SELECTED BLOCK WL3 | Vss |
| GSL | Vread |
| "0" READ BIT LINE BL0 | Vbl→Vbl |
| "1" READ BIT LINE BL1 | Vbl→Vss |
| SL | Vss |
| p-WELL | Vss |

FIG. 29

[DATA ERASE]

| | POTENTIAL |
|---|---|
| SSL | $\alpha \times$Vera FLOATING |
| UNSELECTED BLOCKS WL0~WL2 WL4~WL7 | $\alpha \times$Vera FLOATING |
| STL0,STL1,STL2~STL6 | $\alpha \times$Vera FLOATING |
| GSL | $\alpha \times$Vera FLOATING |
| BL | Vera-Vf |
| SL | Vera-Vf |
| SELECTED BLOCKS WL16~WL23 | Vss |
| p-WELL | Vera |

FIG. 30

[DATA WRITE]

| | POTENTIAL |
|---|---|
| SSL | Vread |
| WORD LINES IN UNSELECTED BLOCK WL0~WL2 WL4~WL7 | Vread |
| STL0,STL1~STL6 | Vread |
| SELECTED WORD LINE IN SELECTED BLOCK WL3 | Vpgm |
| GSL | Vss |
| SL | Vcc |
| p-WELL | Vss |

FIG. 31

CROSS SECTION TAKEN ALONG LINE X-X'

CROSS SECTION TAKEN ALONG LINE Y-Y'

CROSS SECTION TAKEN ALONG LINE X-X'

CROSS SECTION TAKEN ALONG LINE Y-Y'

CROSS SECTION TAKEN ALONG LINE X-X'

CROSS SECTION TAKEN ALONG LINE Y-Y'

CROSS SECTION TAKEN ALONG LINE X-X'

CROSS SECTION TAKEN ALONG LINE Y-Y'

CROSS SECTION TAKEN ALONG LINE X-X'

CROSS SECTION TAKEN ALONG LINE Y-Y'

NON-VOLATILE SEMICONDUCTOR MEMORY DEVICE

BACKGROUND OF THE INVENTION

1. Field of the Invention

The present invention relates generally to a non-volatile semiconductor memory device comprising a NAND cell (a memory cell string) wherein a plurality of electrically rewritable memory cells are connected in series.

2. Description of the Related Art

As an electrically rewritable EEPROM, a NAND cell type EEPROM is known. Each of memory cells of the NAND cell type EEPROM has a stacked transistor wherein a floating gate (a charge storage layer) and a control gate are stacked up on a semiconductor substrate via an insulator film. A plurality of memory cells are connected in series so that adjacent memory cells share a source/drain to constitute a NAND cell. Such NAND cells are arranged in the form of a matrix to form a memory cell array.

The drain on one end of the NAND cell arranged in the column direction of the memory cell array is commonly connected to a bit line via a selecting transistor, and the source on the other end of the NAND cell is connected to a common source line via a selecting transistor. The word lines of memory cell transistors and the gate electrodes of the selecting transistors are commonly connected in the row direction of the memory cell array as word lines (control gate lines) and selecting gate lines, respectively.

Such a NAND cell type EEPROM is known by, e.g., the following literatures (1) and (2).

(1) K. -D. Suh et al., "A 3.3 V 32 Mb NAND Flash Memory with Incremental Step Pulse Programming Scheme", IEEE J. Solid-State Circuits, Vol. 30, pp. 1149–1156, November 1995.

(2) Y. Iwata et al., "A 35 ns Cycle Time 3.3 V Only 32 Mb NAND Flash EEPROM", IEEE J. Solid-State Circuits, Vol. 30, pp. 1157–1164, November 1995.

FIG. 18 shows a NAND cell block of a memory cell array of a NAND cell type EEPROM. A plurality of memory cells M are connected in series so that adjacent memory cells share their sources and drains to constitute a NAND cell. One end of the NAND cell is connected to a bit line BL via a selecting transistor S1, and the other end of the NAND cell is connected to a common grounding conductor via a selecting transistor S2. The control gates of the memory cells M arranged in the lateral direction of FIG. 18 are commonly connected to a word line WL. Similarly, the gates of the selecting transistors S1, S2 are commonly connected to selecting gate lines SSL, GSL. The range of the NAND cell driven by a word line constitutes a NAND cell block.

Usually, such NAND cell blocks are arranged in a direction of a bit line to constitute a memory cell array. Each of the NAND cell blocks serves as a unit for data erase to carry out a so-called batch erase. The memory cell string along a selected word line in the NAND cell block is called one page, which serves as a unit for data read and write.

For example, in the case of an n-channel memory cell transistor, the memory cell M causes a positive threshold state (E type state), in which electrons are injected into a floating gate, and a negative threshold state (D type state), in which the electrons in the floating gate are emitted, to correspond to binary values to store data. For example, the D type state is defined as a data "1" holding state (erase state), and the E type state is defined as a data "0" holding state (write state). In addition, an operation for shifting the threshold of a memory cell, which holds data "1", in a positive direction to the data "0" holding state is defined as a "write operation", and an operation for shifting the threshold of a memory cell, which holds data "0", in a negative direction to the data "1" holding state is defined as an "erase operation". Throughout the specification, the following descriptions are based on these definitions.

FIG. 19 shows the relationship between the potentials of the respective parts in data erase, read and write operations in a selected NAND cell block of a memory cell array. In the erase operation, all of the word lines of the selected NAND cell block are set at 0 V, and the selecting gate lines SSL, GSL and bit lines BL thereof are set in floating (F). In addition, a high positive erase voltage Vera (e.g., an erase pulse of 3 ms and 21 V) is applied to the p-type wells of memory cells. As a result, the erase voltage is applied to the selected block between the wells and word lines, so that electrons in the floating gate are emitted to the wells by the FN (Flower-Nordheim) tunnel current. Thus, the memory cells in the NAND cell block are in an erase state of "1".

At this time, unselected NAND cell blocks are not under the influence of the erase pulse by the capacity coupling of the word lines and wells in the floating state. A coupling ratio is calculated from a capacity connected to a word line in a floating state. In fact, the capacity between a word line of a polysilicon and a p-well in a cell region controls the total capacity. The coupling ratio obtained by the observed result is large, about 0.9. This prevents the FN tunnel current from flowing. An erase verify (verification) is determined by whether the threshold voltages of all of the memory cells in the selected block become, e.g., below −1 V.

The data read operation is carried out by applying 0 V to a selected word line and a given read voltage Vread (a voltage necessary to cause a channel to conduct regardless of the threshold) to unselected word lines and a selecting gate line and by reading the variation in potential of a bit line BL due to the presence of continuity of the selected memory cell.

The data write operation is carried out by applying a high positive write voltage Vpgm to a selected word line, a pass voltage Vpass to unselected word lines, Vcc to a selecting gate line SSL on the bit line side, and Vss=0V to a selecting gate line GSL on the common source line side and by applying Vss to a bit line BL, to which "0" is to be written, and Vcc to a write inhibited bit line BL (i.e., a bit line BL to be held in an erase state of "1"). At this time, in the selected memory cell connected to the bit line, to which the Vss is applied, the channel potential is held to be the Vss, and a great electric field is applied between the control gate and the channel to cause electron injection from the channel to the floating gate due to the tunnel current. In other unselected memory cells, which are connected to the same bit line and to which the Vpass has been applied, sufficient electric field for write is not applied, so that no write operation is carried out.

In the memory cell along the bit line, to which the Vcc has been applied, the channel of the NAND cell is pre-charged to the Vcc or Vcc−Vth (Vth is the threshold voltage of the selecting transistor), so that the selecting transistor is cut off. Then, if the write voltage Vpgm and the pass voltage Vpass are applied to the control gate, the channel potential is raised by the capacity coupling of the channel of the NAND cell in the floating state with the control gate, to which the Vpgm or Vpass has been applied, so that electron injection does not occur.

As described above, electron injection is carried out only in the memory cell at the intersection of the bit line, to which the Vss has been applied, and the selected word line, to which the Vpgm has been applied, so that "0" is written. In the write inhibited memory cell in the selected block, the channel potential is determined by the capacity coupling of the word line with the channel as described above. Therefore, in order to sufficiently enhance the write inhibit potential, it is important to sufficiently carry out the initial charge of the channel and to increase the capacity coupling ratio between the word line and the channel.

The coupling ratio B between the word line and the channel is calculated by $B=C_{ox}/(C_{ox}+C_j)$, wherein $C_{ox}$ is the sum of gate capacities between the word lines and the channels, and $C_j$ is the sum of junction capacitance of the source and drain of the memory cell transistor. In addition, the channel capacity of the NAND cell is the total of the sum $C_{ox}$ of the gate capacities and the sum $C_j$ of junction capacitances. Moreover, other capacities, such as an overlap capacity between a certain selecting gate line and a source, and the capacity between a bit line and a source or a drain, are far smaller than the total channel capacity, so that the other capacities are ignored herein.

In the NAND type EEPROM as described above, the scaling in the plane direction (design rule) is conventionally carried out, but the scaling in the depth direction (oxide film thickness) corresponding thereto is not carried out. Specifically, the thickness of a tunnel oxide film is substantially constant, 10 nm, in NAND type EEPROMs of 16 Mbits, 32 Mbits, 64 Mbits and 256 Mbits. Then, if the thickness of the tunnel oxide film is constant, the rewrite voltage for the memory cell must be maintained to be a constant voltage in order to maintain the electric field, which is applied to the tunnel oxide film, to be constant, so that it is not possible to lower the voltage. Although process engineers have attempted to decrease the thickness of the tunnel oxide film, tunnel oxide films having a thickness of, e.g., 5 nm, have not been realized. In addition, in order to lower the rewrite voltage, the capacity between the control gate and the floating gate may be increased to increase the coupling ratio. However, this can not be easily accomplished, since it is required to decrease the thickness of the oxide film between the control gate and the floating gate and since it is required to increase the area of the capacitor between the control gate and the floating gate.

Finally, in the NAND type EEPROM, it is required to apply a high voltage of about 20 V as the rewrite voltage for 16 Mbits to 256 Mbits. For that reason, the transistor of a row decoder for applying the high voltage to the word line must be designed by a high breakdown voltage transistor. The high breakdown voltage transistor is designed to weaken the applied voltage by relaxing the design rule in comparison with those of usual transistors of peripheral circuits to lengthen the sizes of the respective parts in the transistors. For example, in the case of a 256-Mbit NAND type EEPROM designed by the 0.25 $\mu$m rule, the high breakdown voltage transistor has a design rule several times as large as those of the usual transistors of peripheral circuits. Then, the pitch (length) of one NAND string, which comprises 16 memory cells and two selecting transistors, of a 256-Mbit NAND type EEPROM is 8.5 $\mu$m. In this pitch, two or more high breakdown voltage transistors can not be arranged, and only one high breakdown voltage transistor can be arranged.

For example, in the next generation 1-Gbit NAND type EEPROM, the pitch of one NAND string is about 5 $\mu$m when the 0.15 $\mu$m design rule is applied. In addition, if it is difficult to carry out the scaling in a longitudinal direction, it is not possible to lower the rewrite voltage for the above described reason. Therefore, in the present pitch of one NAND string comprising 16 memory cell transistors and two selecting transistors, a high breakdown voltage transistor having a large size for driving a word line can not be arranged. For that reason, for example, one NAND string must has 32 or 64 memory cells to increase the pitch of one NAND string.

However, if the number of memory cell transistors in one NAND string is simply increased, the size of the erase block is simultaneously increased, because one block in conventional NAND type EEPROMs is the NAND string (NAND cell) to allow erase only block by block. The reason why erase is only allowed in the NAND cell blocks is as follows. For example, assuming that a NAND string comprising 16 memory cells is one of blocks, in which 8 memory cells are rewritten, and that the lower blocks are selected to be rewritten again and again. Then, the stress of the pass voltage Vpass is applied to the word lines of the upper blocks. If a large number of rewrite operations are carried out, the threshold voltages of unselected blocks are changed.

The size of the erase block is 4 Kbytes in a 16-Mbit NAND type EEPROM, 8 Kbytes in a 32-Mbit NAND type EEPROM and 16 Kbytes in a 256-Mbit NAND type EEPROM, so that the size is gradually increased with the increase of the capacity. However, for example, if a NAND type EEPROM is used as a film medium for a digital camera, it is requested to prevent the block size from rapidly be increased in order to maintain compatibility. Therefore, even in the case of a large-capacity 1-Gbit NAND type EEPROM, the erase block size must be 16 Kbytes similar to the 256-Mbit NAND type EEPROM.

SUMMARY OF THE INVENTION

It is therefore an object of the present invention to eliminate the aforementioned problems and to provide a NAND type EEPROM capable of setting a plurality of erase units in one NAND cell block.

In order to accomplish the aforementioned and other objects, according to a first aspect of the present invention, a non-volatile semiconductor memory device comprises: a first signal line; a second signal line; a NAND cell comprising a plurality of electrically rewritable memory cells which are connected in series between the first and second signal lines; and a block dividing selecting transistor, provided between predetermined adjacent memory cells in the NAND cell, for dividing the NAND cell into a plurality of blocks.

According to a second aspect of the present invention, a non-volatile semiconductor memory device comprises: a memory cell array including a plurality of NAND cells, each of the plurality of NAND cells comprising a plurality of electrically rewritable memory cells, which are selected by one of word lines and which are connected in series between a first signal line and a second signal line via a selecting transistor, respectively; an address decoder for selecting one of the memory cells of the memory cell array in response to an address; a sense amplifier circuit for sensing a read data from the memory cell array, the sense amplifier circuit having the function of latching a write data to the memory cell array; and a control circuit for controlling data write, erase and read operations in and from the memory cell array, wherein the memory cell array is divided into a plurality of memory cell units by a block dividing selecting transistor provided between predetermined adjacent memory cells in each of the NAND cells.

According to a third aspect of the present invention, a non-volatile semiconductor memory device comprises: a memory cell array including a plurality of memory cell units, into which a NAND cell block is divided by a block dividing selecting transistor provided between predetermined adjacent memory cells of each of a plurality of NAND cells, each of the plurality of NAND cells comprising a plurality of electrically rewritable memory cells, each of which is selected by a different one of the word lines and which are connected to a bit line in series, the plurality of NAND cells being arranged so as to extend in directions of the word lines to constitute the NAND cell block; an address decoder for selecting one of the memory cells of the memory cell array in response to an address; a sense amplifier circuit for sensing a read data from the memory cell array, the sense amplifier circuit having the function of latching a write data to the memory cell array; and data rewrite means for selecting one of the plurality of memory cell units as an erase unit to batch erase data in the selected one of the plurality of memory cell units and for writing data on one page corresponding to a predetermined range of the plurality of memory cells along one of the word lines.

According to the present invention, it is possible to set a plurality of erase blocks in a single NAND cell block by providing a block dividing selecting transistor in a NAND cell, so that it is possible to increase the number of memory cells in a single NAND string without increasing the erase block size.

According to a fourth aspect of the present invention, a non-volatile semiconductor memory device comprises: first and second signals lines; first and second selecting transistors; first through n-th (n≦3) NAND cell blocks, each of which comprises a plurality of electrically rewritable memory cells connected in series; and first through (n−1)-th block dividing selecting transistors, wherein the first selecting transistor is connected to the first signal line, the first NAND cell block being connected to the first selecting transistor, the i-th (1≦i≦n−1) block dividing selecting transistor of the first through (n−1)-th block dividing selecting transistors being connected to the i-th NAND cell block of the first through n-th (n23 3) NAND cell blocks, the (i+1)-th (1≦i≦n−1) NAND cell block of the first through n-th (n≦3) NAND cell blocks being connected to the i-th block dividing selecting transistor of the first through (n−1)-th block dividing selecting transistors, the second selecting transistor being connected to the n-th NAND cell block of the first through n-th (n≦3) NAND cell blocks, the second signal line is connected to the second selecting transistor, and gates of at least two block dividing selecting transistors of the first through n-th block dividing selecting transistors being commonly connected.

According to a fifth aspect of the present invention, a non-volatile semiconductor memory device comprises: first and second signals lines; first and second selecting transistors; first through n-th memory cells, each of which is electrically rewritable; and first through (n−1)-th block dividing selecting transistors, wherein the first selecting transistor is connected to the first signal line, the first memory cell being connected to the first selecting transistor, the i-th (1≦i≦n−1) block dividing selecting transistor of the first through (n−1)-th block dividing selecting transistors being connected to the i-th memory cell of the first through n-th memory cells, the (i+1)-th (1≦i≦n−1) memory cell of the first through n-th memory cells being connected to the i-th block dividing selecting transistor of the first through (n−1)-th block dividing selecting transistors, the second selecting transistor being connected to the n-th memory cell of the first through n-th memory cells, the second signal line being connected to the second selecting transistor, and gates of at least two block dividing selecting transistors of the first through n-th block dividing selecting transistors being commonly connected.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 8 is a table showing the bias relationship in a data write operation for the NAND type EEPROM in the first preferred embodiment;

FIG. 10 is a table showing the bias relationship in a data read operation for the NAND type EEPROM in the first preferred embodiment;

FIG. 12 is a table showing the bias relationship in a data erase operation in the second preferred embodiment;

FIG. 13 is a table showing the bias relationship in a data write operation in the second preferred embodiment;

FIG. 25 is a table showing the bias relationship in a data read operation in the seventh preferred embodiment;

FIG. 26 is a table showing the bias relationship in a data erase operation in the seventh preferred embodiment;

FIG. 27 is a table showing the bias relationship in a data write operation in the seventh preferred embodiment;

FIG. 29 is a table showing the bias relationship in a data read operation in the eighth preferred embodiment;

FIG. 30 is a table showing the bias relationship in a data erase operation in the eighth preferred embodiment;

FIG. 31 is a table showing the bias relationship in a data write operation in the eighth preferred embodiment;

DESCRIPTION OF THE PREFERRED EMBODIMENTS (First Preferred Embodiment)

Figure 1:
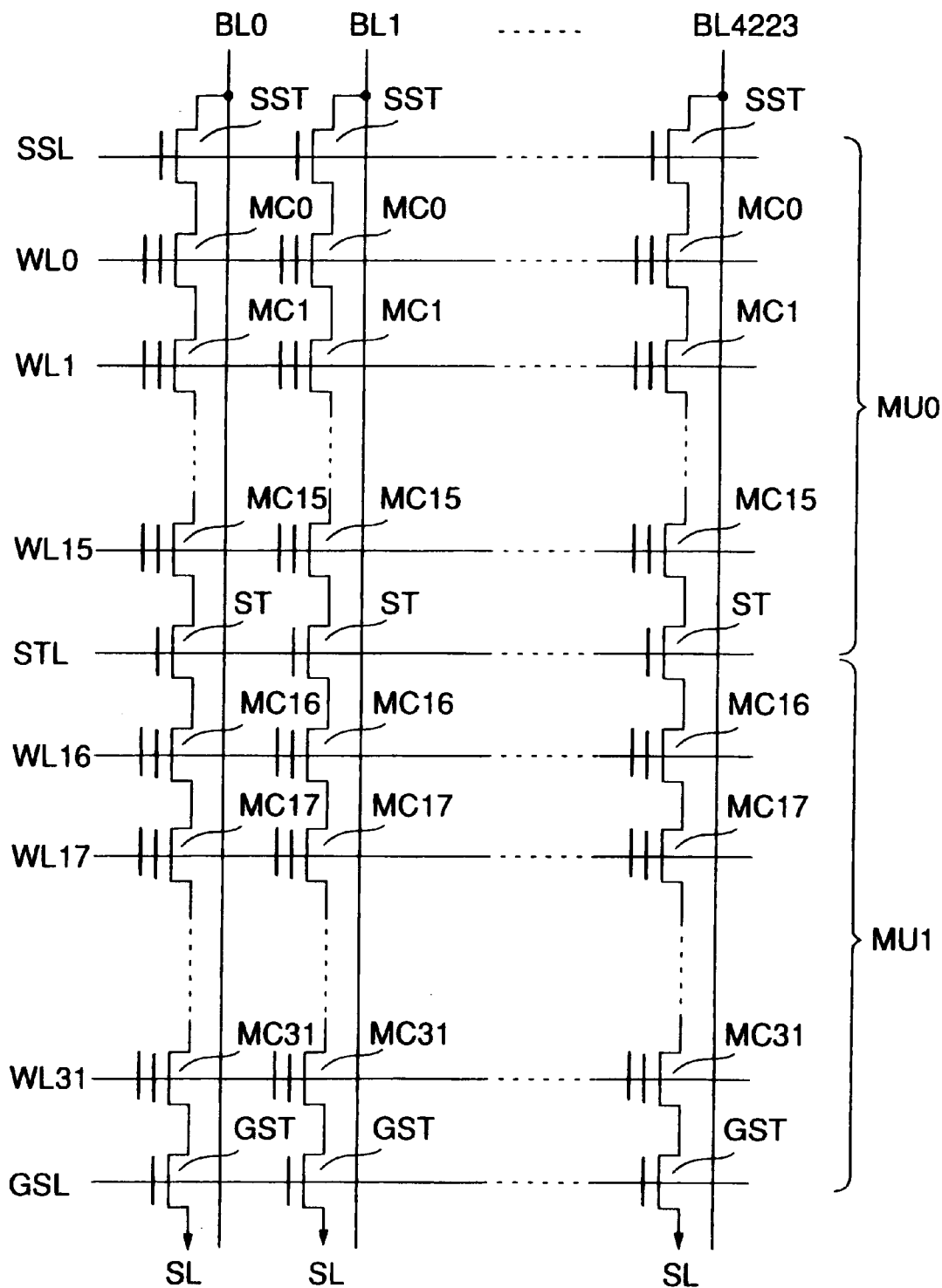
FIG. 1 is an equivalent circuit of the first preferred embodiment of a memory cell array of a NAND type EEPROM according to the present invention.

FIG. 1 is an equivalent circuit of a memory cell array of a NAND cell block 1 of the first preferred embodiment of a NAND type EEPROM according to the present invention. In this embodiment, the number of bit lines BL is 4224 (=(512+16) byte×8). In this preferred embodiment, one NAND cell comprises 32 memory cell transistors MC0 through MC31. The memory cell transistors MC0 through MC31 are connected in series between a bit line BL and a source line SL. A selecting transistor SST is provided between the bit line BL and the memory cell transistor MC0. Similarly, a selecting transistor GST is provided between the source line SL and the memory cell transistor MC31.

In this preferred embodiment, in addition to the above described two selecting transistors SST and GST, a selecting transistor ST for dividing one NAND cell into two blocks is provided. That is, by providing the block dividing transistor ST between the adjacent memory cell transistors MC15 and MC16, the NAND block 1 is divided into two memory units MU0 and MU1. The size of each of the divided memory units MU0 and MU1 is a unit block size for data erase.

Figure 2:
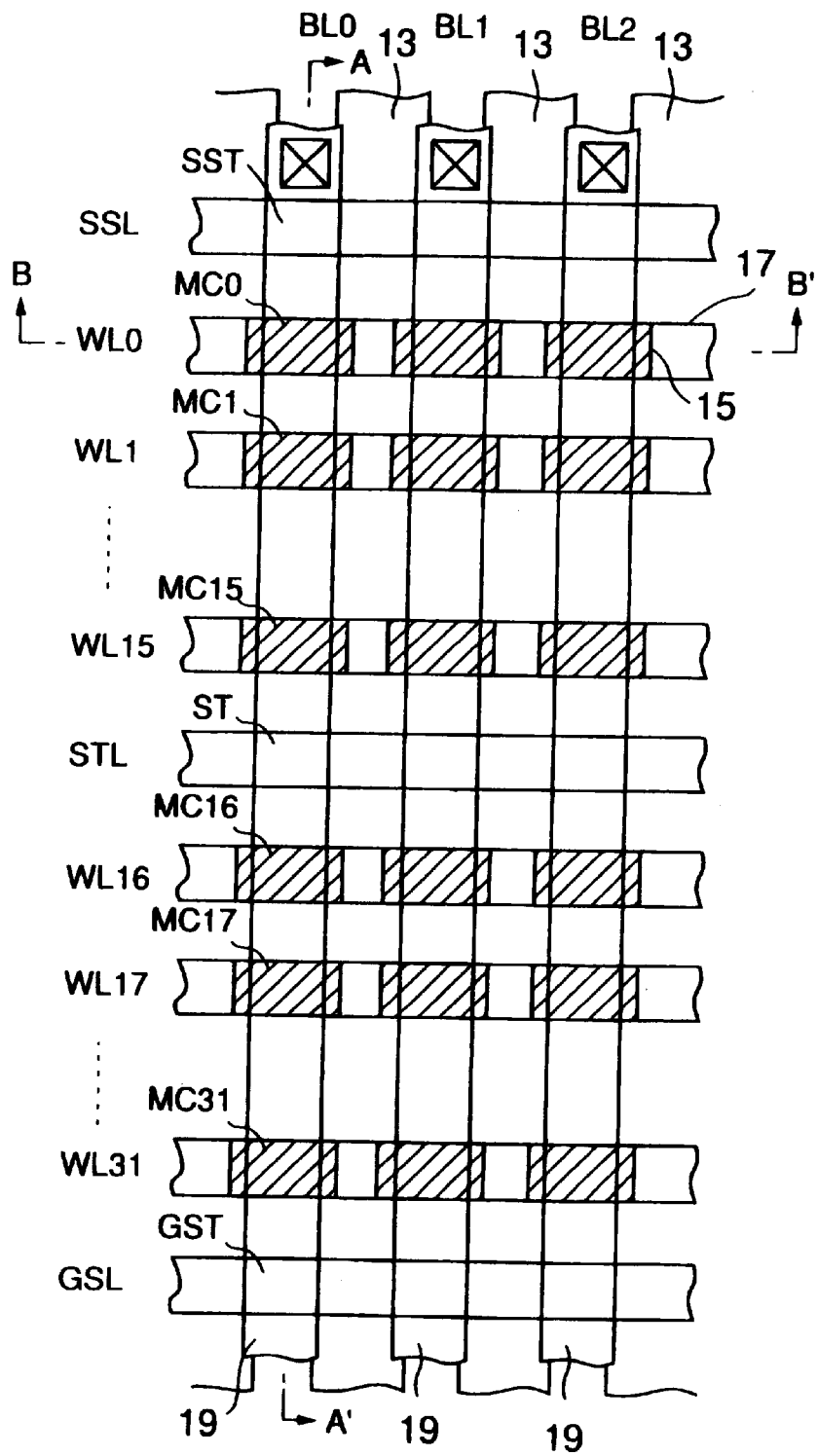
FIG. 2 is a layout of the memory cell array in the first preferred embodiment.
Figure 3:
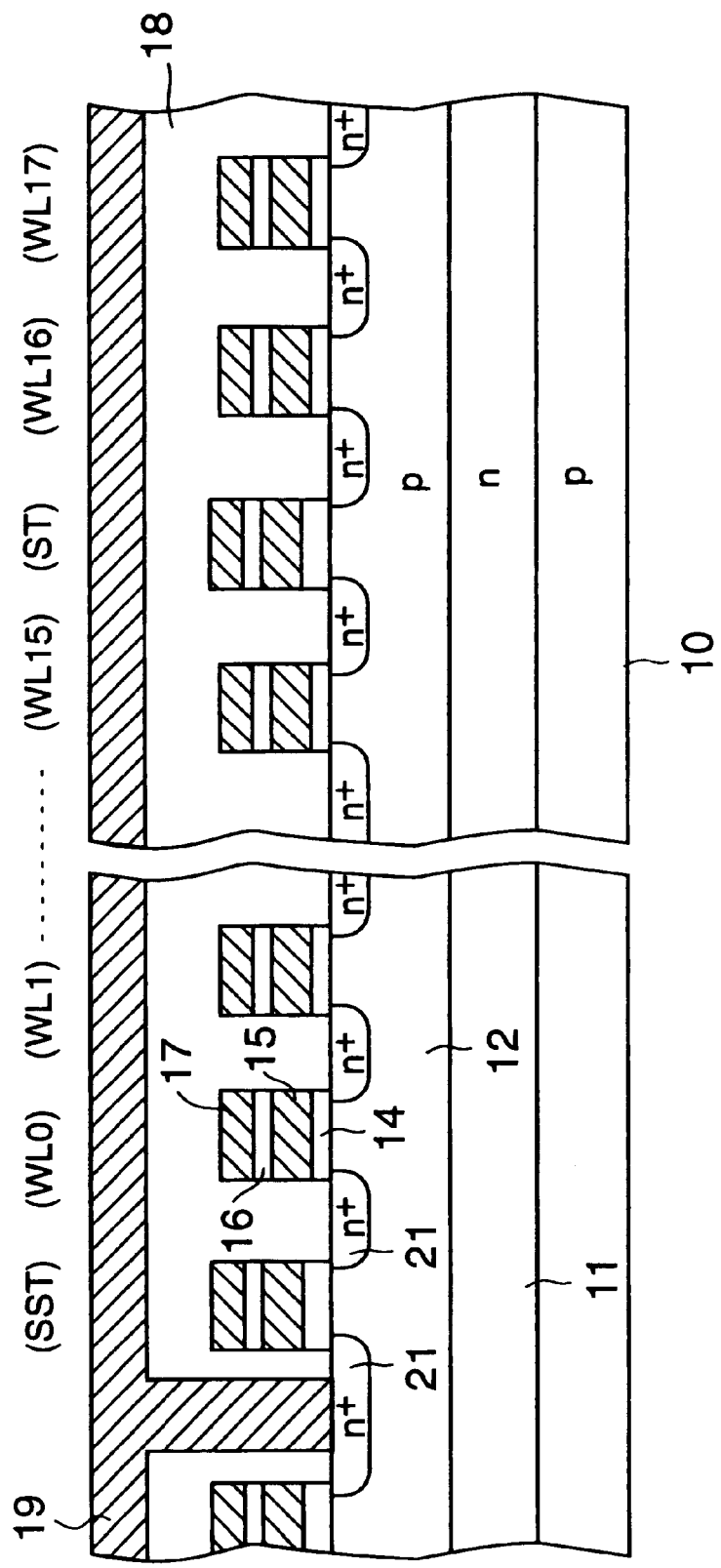
FIG. 3 is a sectional view taken along line A–A' of FIG. 2.
Figure 4:
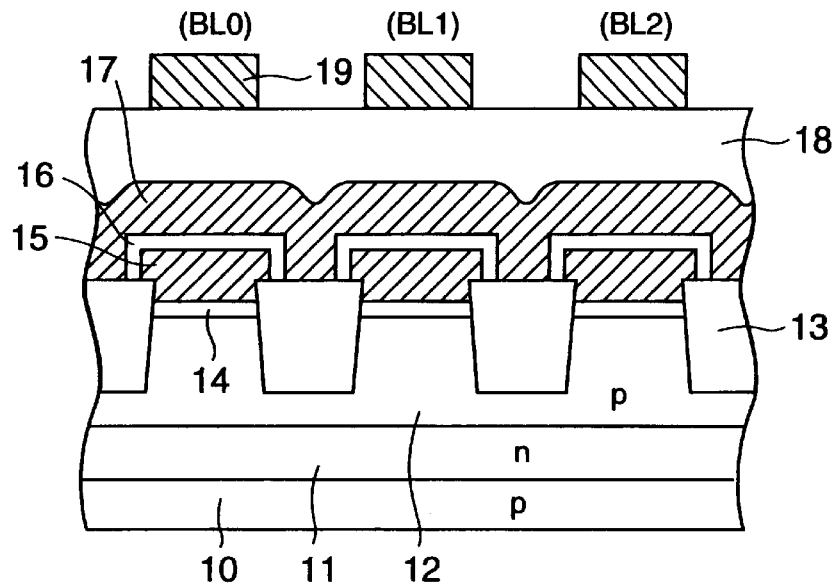
FIG. 4 is a sectional view taken along line B–B' of FIG. 2.

FIG. 2 is a layout of the NAND cell block 1, and FIGS. 3 and 4 are sectional views taken along lines A–A' and B–B' of FIG. 2, respectively. An n-type well 11 is formed in the memory cell array region of a p-type silicon substrate 10, and a p-type well 12 is formed in the n-type well 11. The p-type well 12 is divided by an element isolating insulator film 13 to form element regions therein. For each memory cell transistor, a floating gate 15 is formed on the element region via a tunnel oxide film 14, and a control gate 17 is formed thereon via a gate insulator film 16.

As shown in FIG. 2, the control gate 17 is provided so as to continuously extend in a row direction, and serves as a word line WL. By carrying out the ion implantation using the control gate 17 as a mask, a source/drain diffusion layer 21 is formed. In FIG. 3, the selecting transistors SST and ST have the same structure as that of the memory cell transistor MC. In a cross section corresponding to the cross section of FIG. 4, a layer corresponding to the floating gate 15 and a layer corresponding to the control gate 17 are commonly connected at a predetermined place to be continuously provided to serve as selecting gate lines SSL and STL. The selecting transistor GST on the source side is the same, and the gate thereof is continuously provided to serve as a selecting gate line GSL. The thickness of the gate oxide film for the selecting transistors SST, ST may be different from that for the memory cell transistor MC.

Figure 5:
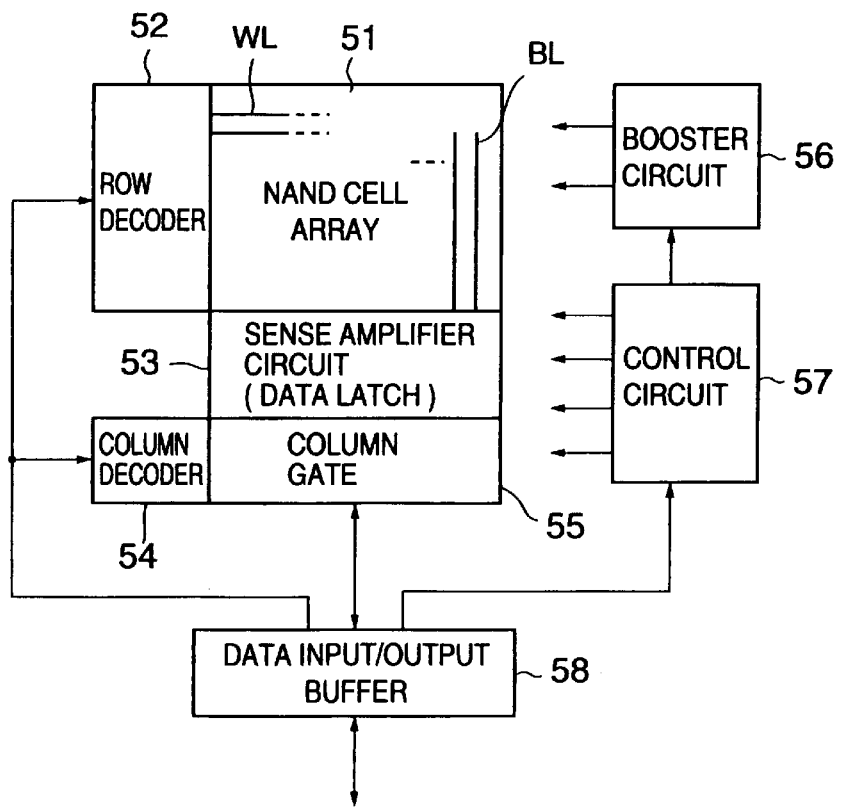
FIG. 5 is a block diagram of the NAND type EEPROM in the first preferred embodiment.

The whole block construction of a NAND type EEPROM having the page write/read function is shown in FIG. 5. As shown in this figure, the NAND type EEPROM has a memory cell array 51, a row decoder 52 for selectively driving the word lines of the memory cell array 51 on the basis of an address inputted from the outside, and a sense amplifier circuit 53 which is connected to the bit lines BL of the memory cell array 51 and which has the latch function for input/output data. The sense amplifier circuit 53 is connected to a column gate 55. By controlling the column gate 55 on the basis of an address inputted from the outside by the column decoder 54, a corresponding bit line and a corresponding sense amplifier circuit are selected.

The sense amplifier circuit 53 is connected to a data input/output (I/O) buffer 58 via the column gate 55. A booster circuit 56 is provided for supplying a high voltage necessary for write and erase operations, and a control circuit 57 is provided for generating a control signal for data write, data erase and read in and from the memory cell array 51 to control the interior of the chip and for establishing the interface to the outside.

The row decoder 52 is designed to selectively drive a plurality of word lines WL in response to an address signal during each of data write, erase and read operations. To the word line driver thereof, a required voltage is supplied. The sense amplifier circuit 53 has the function of sensing bit line data during a read operation, the data latch function of holding data loaded from the outside during a write operation, and the function of selectively supplying a required voltage to the bit lines BL during each of write and erase operations.

The control circuit 57 includes a sequential control means (e.g., a programmable logic array) for controlling erase/erase verify, write/write verify, and read operations for the NAND cells.

Figures 6, 7:
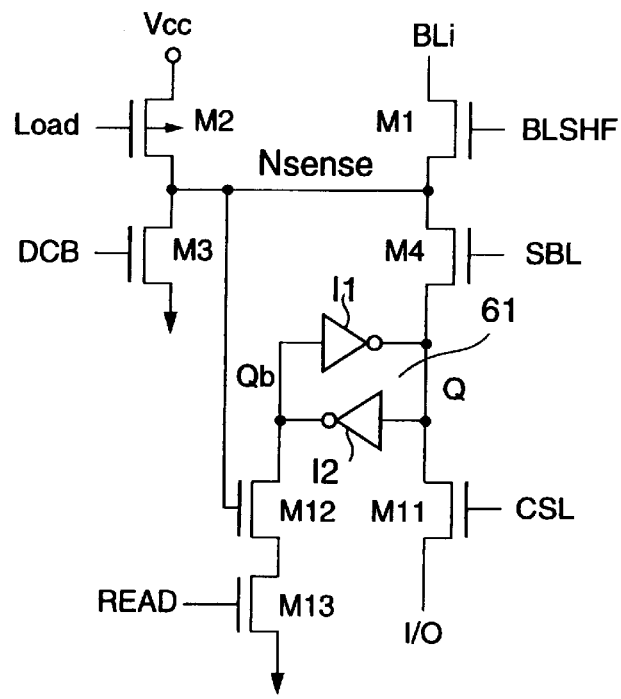
FIG. 6 is a circuit diagram of a sense amplifier of the NAND type EEPROM in the first preferred embodiment.
FIG. 7 is a table showing the bias relationship in a data erase operation for the NAND type EEPROM in the first preferred embodiment.

FIG. 6 shows one of the sense amplifiers of the sense amplifier circuit 53. The sense amplifier mainly comprises a data latch circuit 61 comprising inverters 11 and 12, the input and output of one of which are connected to the output and input of the other inverter, respectively. One node Qb of the latch circuit 61 is grounded via a sensing NMOS transistor M12 and an activating NMOS transistor M13. The gate of the sensing NMOS transistor M12 serves as a sense node Nsense. The sense node Nsense is connected to a bit line BLi via a transfer gate NMOS transistor M1.

The other node Q of the latch circuit 61 is connected to the sense node Nsense via a resetting NMOS transistor M4, and to an input/output buffer via a column selecting NMOS transistor M11. In the sense node Nsense, an NMOS transistor M2 for pre-charging the sense node Nsense and an NMOS transistor M3 for discharging the sense node Nsense are also provided.

The data erase, write and read operations for the NAND type EEPROM in this preferred embodiment will be described below.

FIG. 7 shows the relationship between the bias potentials of the respective parts during a data erase operation. As described above, in the conventional NAND type EEPROM, one NAND cell block corresponds to an erase unit, whereas in this preferred embodiment, each of the memory units MU0 and MU1 shown in FIG. 1 corresponds to an erase unit. FIG. 7 shows an example of a data erase operation when the lower memory unit MU1 is a selected block and when the upper memory unit MU0 is an unselected block.

That is, in FIG. 1, assuming that the range of the word lines WL0 through WL15 corresponds to an unselected block and that the range of the word lines WL16 through WL31 corresponds to a selected block. When an erase operation is started, a Vss (0 V) is applied to the word lines WL16 through WL31 corresponding to the selected block to be erased, and the word lines WL0 through WL15 corresponding to the unselected block and the selecting gate lines SSL, GSL and STL are set to be in a floating state. In this state, an erase voltage Vera (20 V) is applied to the p-well of the memory array.

At this time, the word lines WL0 through WL15 of the unselected block and selecting gate lines SSL, STL and GSL are boosted to α× Vera by the capacity coupling with the p-well. Since α is about 0.9, the lines WL0 through WL15, SSL, STL and GSL are boosted to about 18 V. In addition, in the bit lines BL0 and BL1 and the source line SL, the p-n junctions between the p-well and the n$^+$-type diffusion layer of the bit line contact part and between the p-well and the n$^+$-type diffusion layer of the source line SL part are in a forward bias state, so that the lines BL0, BL1 and SL are boosted to Vera−Vf. Since Vf is the built-in potential of the p-n junction, which is about 0.7 V, the bit lines BL0 and BL1 and the source line SL have a voltage of about 19.3 V. Therefore, in the memory cell transistors along the word lines WL0 through WL15 of the unselected block, no erase operation occurs.

In the memory cell transistors along the word lines WL16 through W31 of the selected block, Vera is applied to the substrate region, and Vss is applied to the control gate. Therefore, the electrons of the floating gate are emitted to the substrate region (p-well) by the tunnel current, so that the stored data of the memory cell transistors are batch-erased.

FIG. 8 shows the relationship between the bias potentials of the respective parts during a data write operation. FIG. 8 shows a case where data are written in the word line WL17 in the selected block (i.e., the memory unit MU1), the data of which have been batch-erased. In addition, there is supposed a case where data "0" are written in the bit line BL0 and data "1" are written in the bit line BL1 (i.e., write inhibit for holding the erase state of the data "1").

Figure 9:
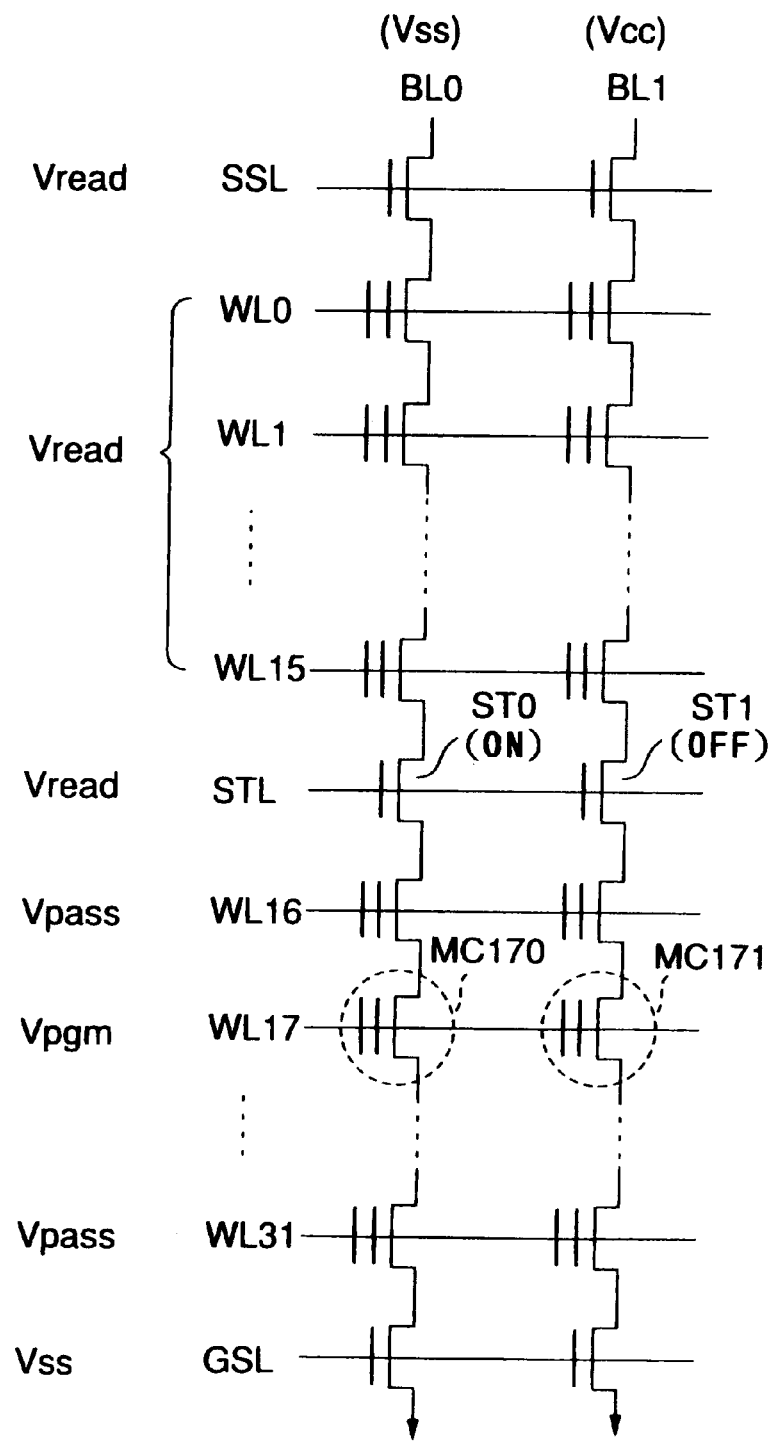
FIG. 9 is a diagram showing the bias relationship of FIG. 8 on the memory cell array.

In this case, FIG. 9 shows the relationship between potentials about only two bit lines BL0 and BL1 taken out of the bit lines shown in FIG. 1.

In this data write operation, a ground potential Vss for write and a power supply potential Vcc for write inhibit are first applied to the bit lines BL0 and BL1, respectively. Thereafter, while the voltage of the selecting gate line GSL on the source side is maintained to be Vss, a read voltage Vread (about 3.5 V), which is slightly higher than Vcc, is applied to other word lines and selecting gate lines. Thus, the potential Vss for write is transmitted to the NAND cell channel connected to the bit line BL0. Although the Vcc for write inhibit is transmitted to the NAND cell channel connected to the bit line BL1, if the potential of the channel is boosted to a value lowered by Vread−Vth (a high threshold voltage of the threshold voltages of selecting transistors or memory cell transistors), the selecting transistor SST is turned off, and the channel becomes floating.

Then, in this state, among the word lines of the selected block, a pass voltage Vpass (about 8 V) higher than the read voltage Vread is applied to the unselected word lines WL16 and WL18 through WL31, in which no write operation is carried out, and a write voltage Vpgm (about 16 V) higher than the pass voltage Vpass is applied to the selected word line WL17, in which a write operation is carried out. The potentials of the word lines WL0 through WL15 of the unselected block, the drain-side selecting gate line SSL and the block dividing selecting gate line STL are maintained to the value Vread.

At this time, the channel region on the side of the bit line BL1 in the selected block is boosted to β×(vpass−Vread)+(Vcc−Vth) by the capacity coupling with the word boosted from the initial state potential Vcc−Vth to the potentials Vpass and Vpgm. Since the number of word lines, to which the potential Vpass is applied, is 15 for one word line, to which the potential Vpgm is applied, the channel potential is the above described channel potential substantially determined to the value Vpass. The β is a capacity coupling ratio of the word line to the channel region, which is about 0.5.

At this time, in the block dividing selecting transistor ST1 on the side of the write inhibited bit line BL1, the gate voltage is Vread, and the channel voltage is boosted as described above. As a result, the gate-to-source voltage is negative, so that the transistor ST1 is cut off. That is, on the side of the write inhibited bit line BL1, the channel region in the selected block including the memory cell transistor MC171 is boosted in a floating state separated from the channel region on the side of the memory cell unit MU0 which is the unselected block.

On the other hand, on the side of the bit line BL0, to which the potential Vss has been applied, the block dividing selecting transistor ST0 remains being turned on by the potential Vss transmitted from the bit line BL0. Therefore, the potential Vss is transmitted to the channel of the selected memory cell transistor MC170. As a result, in the memory cell transistor MC170 driven by the selected word line WL17, to which the write voltage Vpgm has been applied, a write operation occurs due to the tunnel injection. In other memory cells along the same bit line BL0, a large electric field is not applied, so that no write operation occurs.

Furthermore, in the actual data write operation, a verify (verification) operation for checking the write voltage pulse impression and the threshold after write is repeated by a sequential control using the control circuit 57 of FIG. 5 to control data for one page within a predetermined range of threshold. For example, although one page corresponds to the number of bit lines in the range of one word line, there are some cases where the range of one word line corresponds to two pages in connection with a page buffer and so forth.

Such a data write cycle per page will be described. First, write data are continuously loaded on the data latch of the sense amplifier circuit 53 of FIG. 5. At this time, "0" is a cell data for carrying out a write operation, and "1" is a cell data for inhibiting a write operation. The write cycle comprises the following steps:

(1) The level of a bit line is set at Vss or Vcc in accordance with data latched by a sense amplifier;
(2) A write voltage pulse is applied to a selected word line;
(3) The selected word line is discharged; and
(4) A write verify read is carried out.

In the verify operation, data of a data latch corresponding to a cell, in which a write operation has been sufficiently carried out, is changed from "0" to "1" so as not to further carry out the write operation. The bias conditions for the verify operation are basically the same as those for a usual data read. However, in order to determine the threshold, the voltage applied to the selected word line is set to be higher than 0 V which is a voltage applied during a usual read operation. With respect to only a cell wherein it has been determined by the verify operation that write in the cell is insufficient, the write operation is repeated again in the next cycle.

FIG. 10 shows the relationship between the potentials of the respective parts during a data read operation. When the read operation is started, the bit lines are pre-charged to a potential Vb1 (about 1.5 V) in the initial state. Then, the potentials of all of the selecting gate lines and word lines in the selected NAND cell are set at a read voltage Vread, except that the potential of the selected word line (WL19 in FIG. 10) of the selected block is set at Vss. Thus, the potential of the bit line for reading data "0" (a memory cell in a write state) is held at Vb1, and the potential of the bit line for reading data "1" (a memory cell in an erase state) is changed from VBb1 to Vss. This change in potential of the bit line is determined as "0" or "1" by the sense amplifier similar to the conventional method.

As described above, according to this preferred embodiment, the interior of the NAND cell block can be divided into two memory cell units by the block dividing selecting transistor to carry out the data rewrite operation using one memory cell unit as an erase unit. Thus, the following effects can be obtained. That is, when a NAND type EEPROM is produced by a finer design rule than the current design rule, it is required to increase the number of memory cells in one NAND cell in order to arrange a high breakdown voltage transistor for driving a memory array. According to the conventional systems, the size of the NAND cell block is directly the erase block size. Therefore, if the number of the memory cells of the NAND cell increases, the erase block size also increases. On the other hand, according to this preferred embodiment, it is possible to increase the number of the memory cells of the NAND cell without increasing the erase block size. Thus, it is easy to arrange the high breakdown voltage transistor. It is also possible to comply with the request that the erase block size should not be changed even if the capacity of the EEPROM increases.

In addition, during a write operation after erasing data, while the read voltage Vread lower than the pass voltage Vpass is applied to the block dividing selecting transistor provided between the memory cell units and to the word lines of the unselected block (memory cell unit), the channel regions of the unselected block are separated from the channel region of the selected block. Therefore, it is possible to reduce stress and improve reliability without applying the pass voltage to the word lines of the unselected block, similar to a case where the erase unit is set in the NAND cell block with the conventional construction to repeat the data rewrite operation.

In the first preferred embodiment, while the NAND cell block has been divided into two memory units by inserting one block dividing selecting transistor, the NAND cell block may be divided into $2^n$ memory cell units by inserting 2–1 (n: positive integer) block dividing selecting transistors. In this case, each of the memory cell units may include the same number of $2^m$ (m: positive integer) memory cells, or the number $2^m$ of the memory cells of each of the memory cell units may be different from each other.

(Second Preferred Embodiment)

Figure 11:
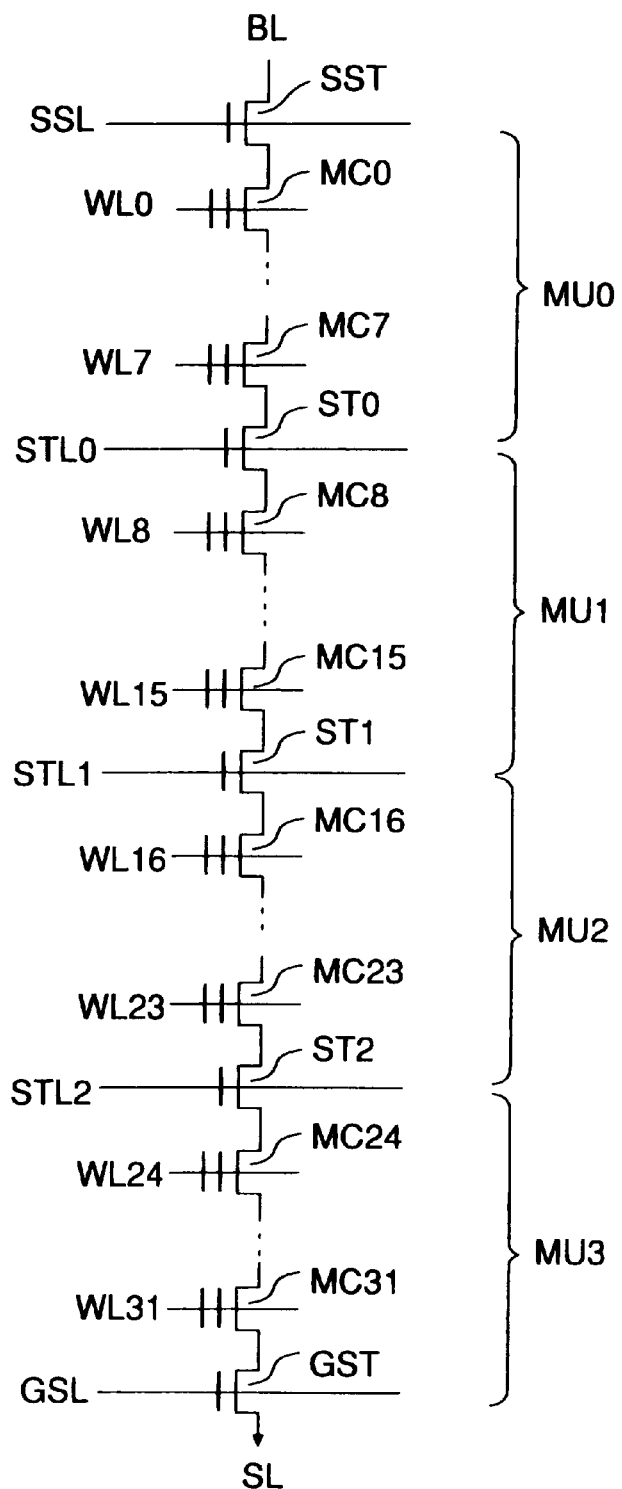
FIG. 11 is a diagram showing the second preferred embodiment of a memory cell array according to the present invention.

FIG. 11 shows the second preferred embodiment of the present invention wherein a NAND string comprising 32 memory cell transistor is divided into four memory cell units MU0 through MU3. The four memory cell units MU0 through MU3 are connected in series between a bit line BL and a source line SL via a selecting transistor SST on the side of the bit line BL, block dividing selecting transistors ST0 through ST2 and a selecting transistor GST on the side of the source line SL. Each of the memory cell units equally includes eight memory transistors.

FIG. 12 shows bias states when the memory cell unit MU2 is selected to be erased in this preferred embodiment. In this case, a potential Vss is applied to word lines WL16 through WL23 in a selected block (i.e., the memory cell unit MU2). In addition, other unselected word lines and selecting gate lines are floating, and an erase voltage Vera is applied to p-wells. Thus, similar to the first preferred embodiment, the batch erase for the selected block is carried out.

FIG. 13 shows bias states when a data write operation is carried out in the word line WL19 in this preferred embodiment. Also in this case, all of the potentials of the word lines of the memory cell units MU0, MU1 and MU3, which are unselected blocks in the selected NAND cell, are set at a read voltage Vread. In the selected memory cell unit MU2, a write voltage Vpgm is applied to the selected word line WL19, and a pass voltage Vpass is applied to other unselected word lines. Thus, it is possible to obtain bias states for write and write inhibit in accordance with the data potential applied to the bit line BL along the word line WL19.

Also according to this preferred embodiment, it is possible to increase the number of the memory cells of the NAND cell without increasing the erase block size. Thus, it is easy to arrange a high break down voltage transistor. It is also possible to comply with the request that the erase block size should not be changed even if the capacity of the EEPROM increases.

In addition, during a write operation after erasing data, while the read voltage Vread lower than the pass voltage Vpass is applied to the block dividing selecting transistor provided between the memory cell units and to the word lines of the unselected block (memory cell unit), the channel regions of the unselected block are separated from the channel region of the selected block. Therefore, it is possible to reduce stress and improve reliability without applying the pass voltage to the word lines of the unselected block.

Moreover, in this preferred embodiment, the potential of the source line SL is set at Vcc in a write operation in order to reduce a leak current in the write inhibited channel region of the selected memory cell unit MU2. Thus, the channel region of the memory cell unit MU3 is charged to Vcc−Vth. Thus, a backward bias effect acts on the block dividing selecting transistor ST2, so that the leak current is reduced. Simultaneously, it is possible to reduce the drain-to-source voltage applied to the block dividing selecting transistor to restrain the punch-through of the transistor ST2.

(Third Preferred Embodiment)

Figure 14:
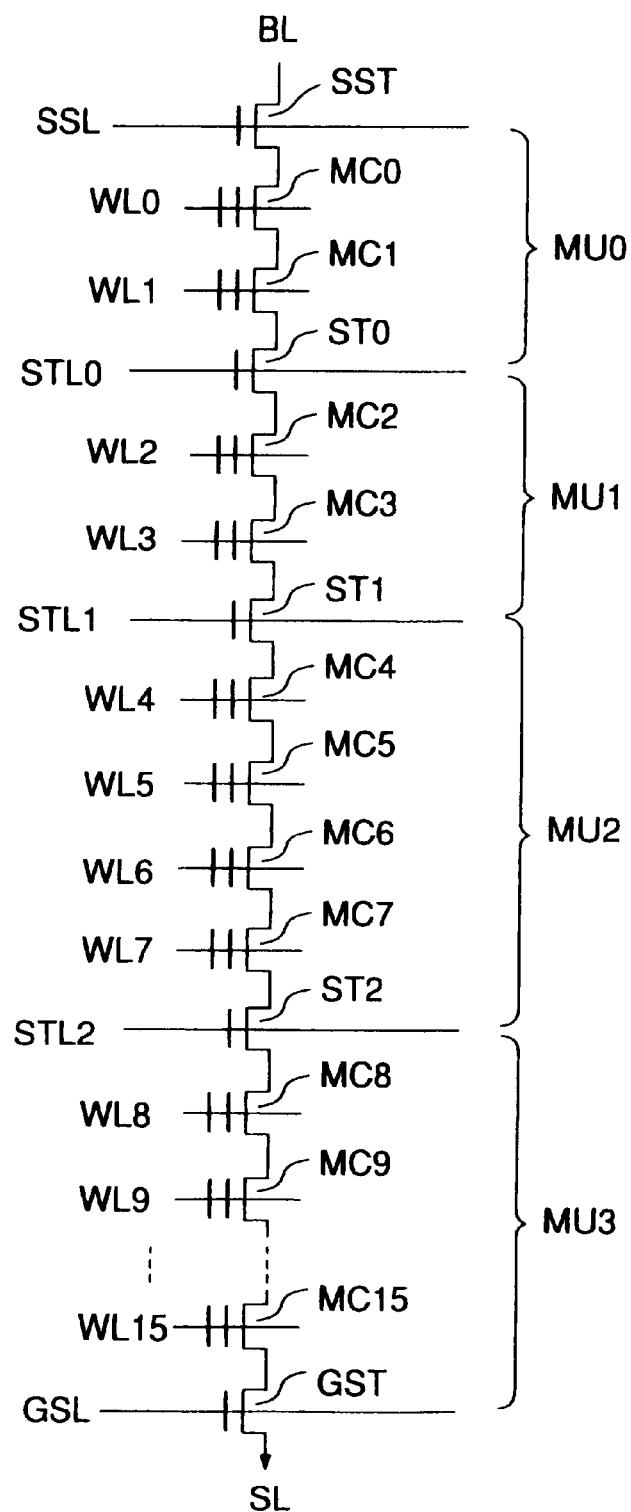
FIG. 14 is a diagram showing the third preferred embodiment of a memory cell array according to the present invention.

FIG. 14 shows the third preferred embodiment of the present invention wherein the number of memory cell transistors in a memory cell unit is changed. In this preferred embodiment, each of memory cell units MU0 and MU1 comprises two memory cell transistors connected in series. In addition, a memory cell unit MU2 comprises four memory cell transistors, and a memory cell unit MU3 comprises eight memory cell transistors.

Also according to this preferred embodiment, it is possible to increase the number of the memory cells of the NAND cell without increasing the erase block size, so that it is easy to arrange a high breakdown voltage transistor. It is also possible to comply with the request that the erase block size should not be changed even if the capacity of the EEPROM increases.

In addition, during a write operation after erasing data, while the read voltage Vread lower than the pass voltage Vpass is applied to the block dividing selecting transistor provided between the memory cell units and to the word lines of the unselected block (memory cell unit), the channel regions of the unselected block are separated from the channel region of the selected block. Therefore, it is possible to reduce stress and improve reliability without applying the pass voltage to the word lines of the unselected block.

Moreover, if various memory cell units having a different number of memory cells according to this preferred embodiment, it is possible to suitably select the data rewrite size. Therefore, this preferred embodiment is suitable for various applications.

(Fourth Preferred Embodiment)

Figure 15:
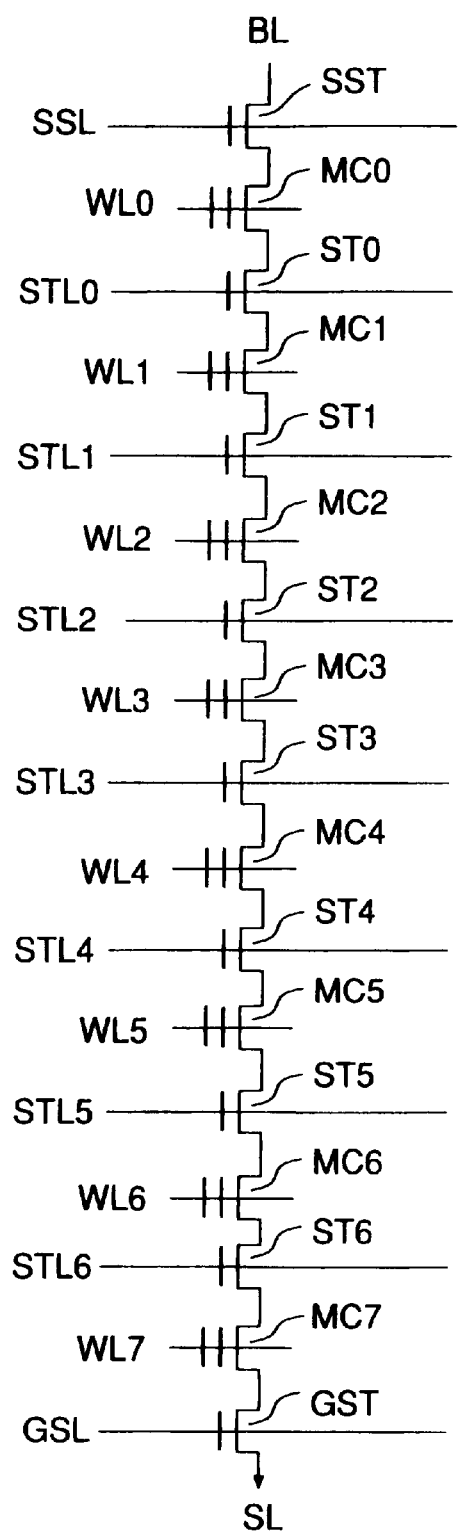
FIG. 15 is a diagram showing the fourth preferred embodiment of a memory cell array according to the present invention.

FIG. 15 shows the fourth preferred embodiment of the present invention wherein each of memory units comprises a single transistor and wherein block dividing selecting transistors and memory cell transistors are alternately connected in series.

Also according to this preferred embodiment, it is possible to increase the number of the memory cells of the NAND cell without increasing the erase block size, so that it is easy to arrange a high breakdown voltage transistor. It is also possible to comply with the request that the erase block size should not be changed even if the capacity of the EEPROM increases.

In addition, during a write operation after erasing data, while the read voltage Vread lower than the pass voltage Vpass is applied to the block dividing selecting transistor and to the word lines of the unselected block (memory cell unit), the channel regions of the unselected block are separated from the channel region of the selected block. Thus, it is possible to reduce stress and improve reliability when an erase unit is set in the NAND cell block to repeat data rewrite operations.

Moreover, according to this preferred embodiment, it is possible to rewrite data page by page since the erase block size is the same the write page size.

(Fifth Preferred Embodiment)

Figure 16:
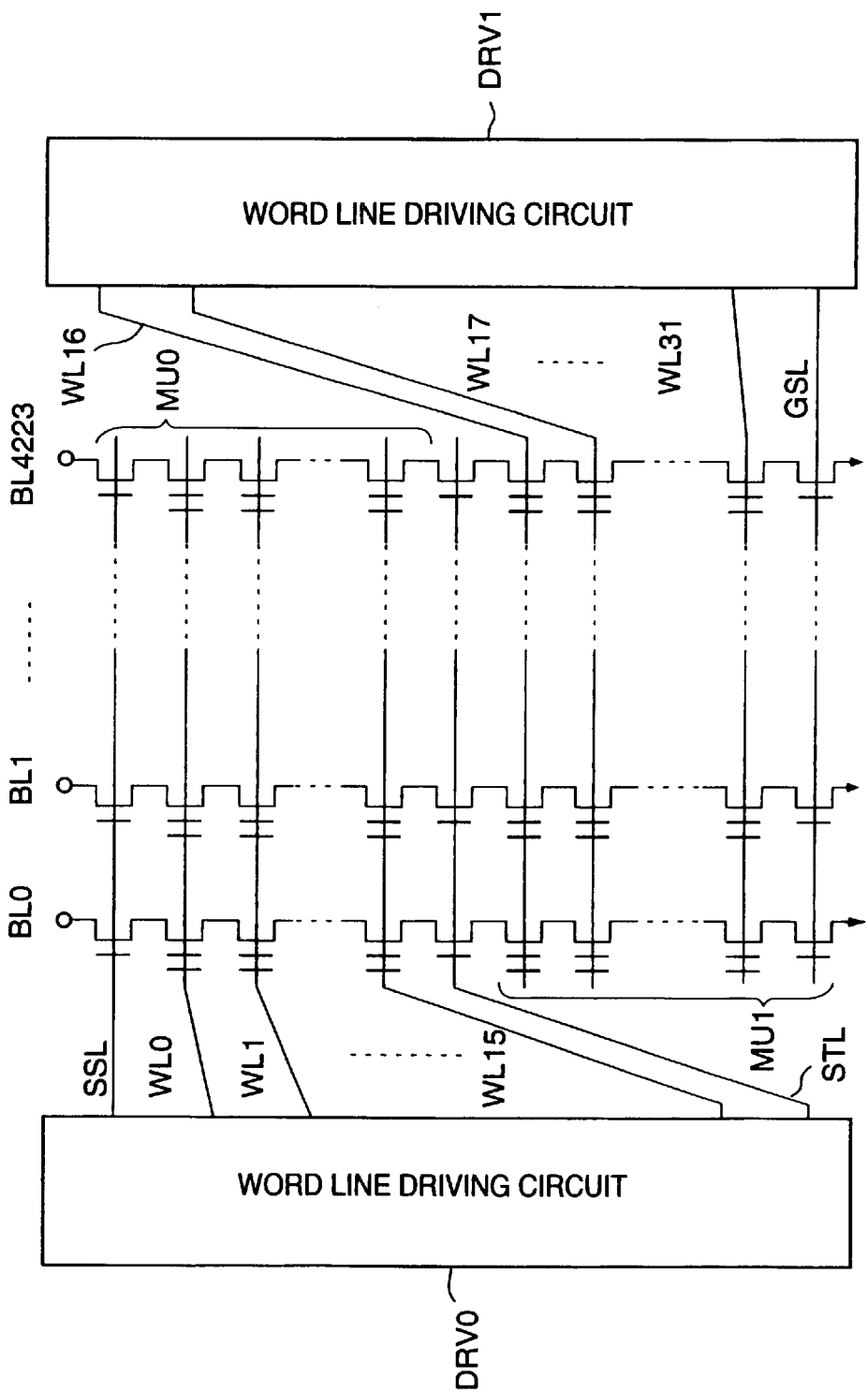
FIG. 16 is a diagram showing the arrangement of the fifth preferred embodiment of a word line driving circuit according to the present invention.

FIG. 16 shows the fifth preferred embodiment of the present invention wherein a word line driving circuit DRV0 for a memory cell unit MU0 of a row decoder and a word line driving circuit DRV1 for a memory cell unit MU1 thereof are distributed to both ends in the directions of the word lines of the memory cell array in the first preferred embodiment. When the number of the memory cell units is large, 4, the word line driving circuits are arranged on both sides of the memory cell array so that the word line driving circuits for the adjacent two memory cell units are distributed right and left in the same manner.

Methods for distributing word line driving circuits right and left for each NAND cell block are disclosed in Japanese Patent Application No. 6-198840 (filed on Aug. 23, 1994), U.S. Pat. No. 5,517,457, U.S. Pat. No. 5,615,163 and so forth. According to the present invention, the interior of the NAND string is divided into blocks as memory cell units. Therefore, by distributing the word line driving circuits for each block as shown in the figure, it is possible to improve the flexibility on the layout to carry out compact design in comparison with a case where the word line driving circuits are distributed for each NAND string. This is particularly effective whenthedesign rule is too small to arrange the high breakdown voltage transistor of the word line driving circuit within the width of a single memory cell unit.

(Sixth Preferred Embodiment)

Figure 17:
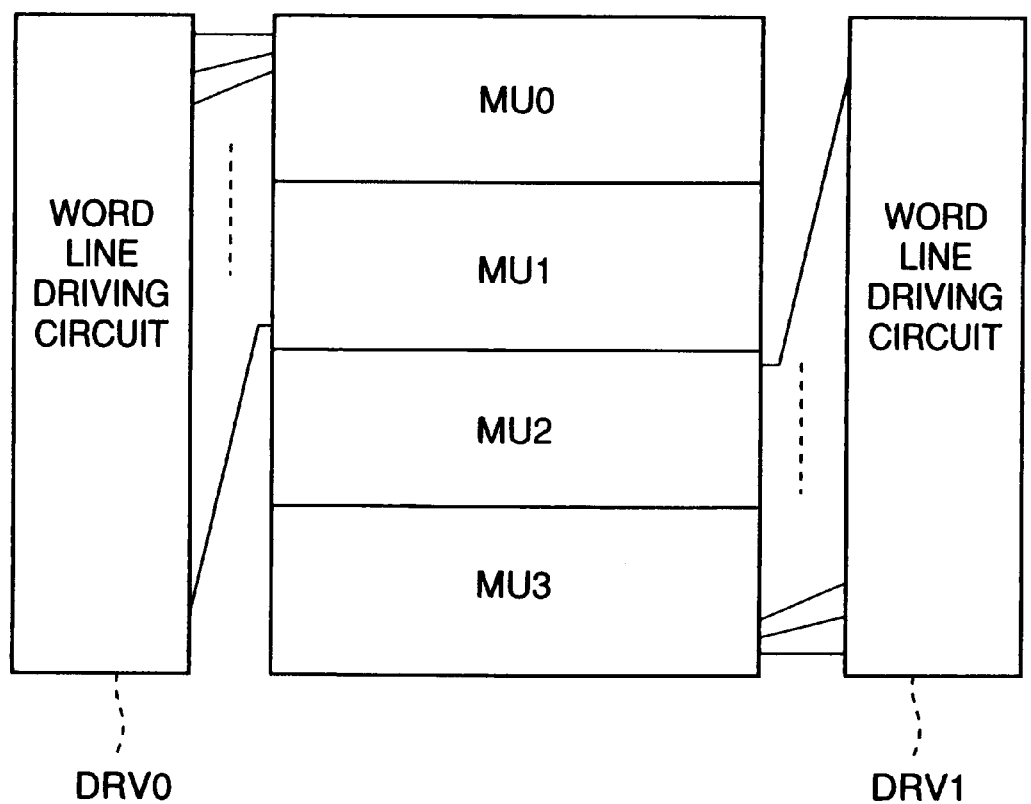
FIG. 17 is a diagram showing the arrangement of the sixth preferred embodiment of a word line driving circuit according to the present invention.
Figures 18, 19:
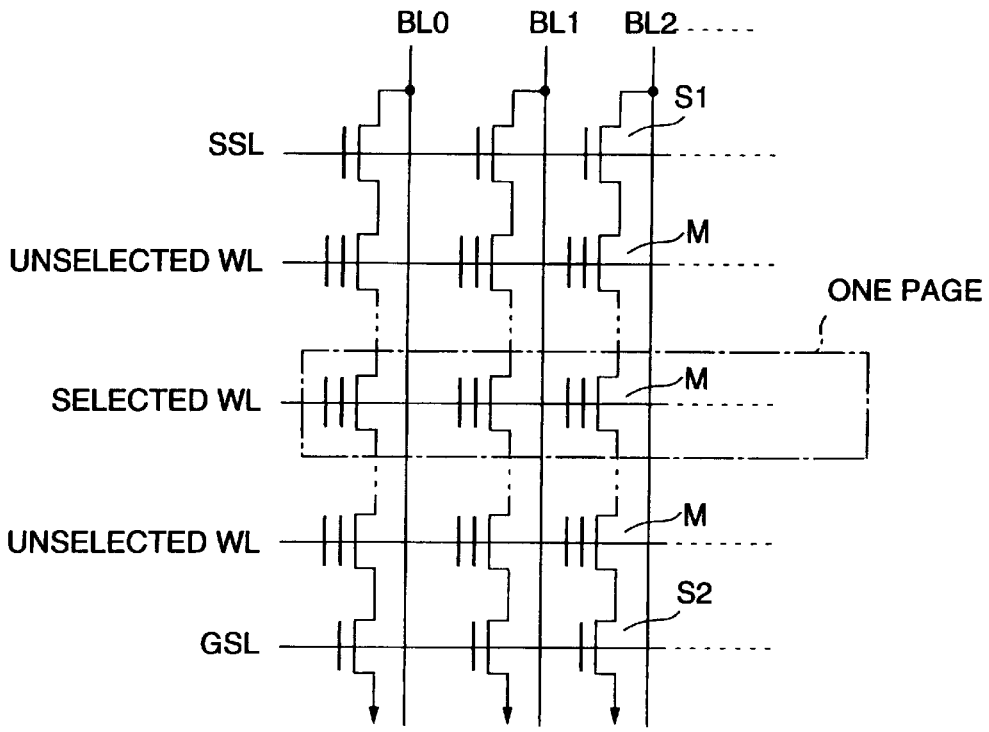
FIG. 18 is a diagram showing a memory cell array of a conventional NAND type EEPROM.
FIG. 19 is a table showing the bias relationship in data erase, read and write operations for the conventional NAND type EEPROM.

FIG. 17 shows the sixth preferred embodiment of the present invention wherein word line driving circuits DRV0 and DRV1 are distributed right and left every two memory cell units. Theword line driving circuits may be arranged in this way when the design rule is smaller than that in the fifth preferred embodiment shown in FIG. 5 so that the high breakdown voltage transistor can not be arranged within two memory cell units.

Figure 20:
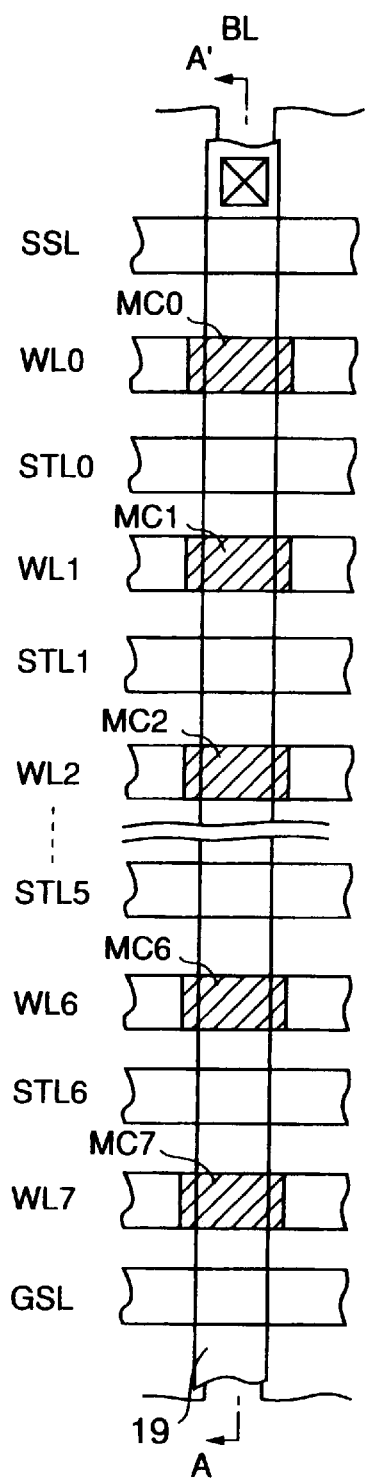
FIG. 20 is a layout of the memory cell array in the fourth preferred embodiment.
Figure 21:
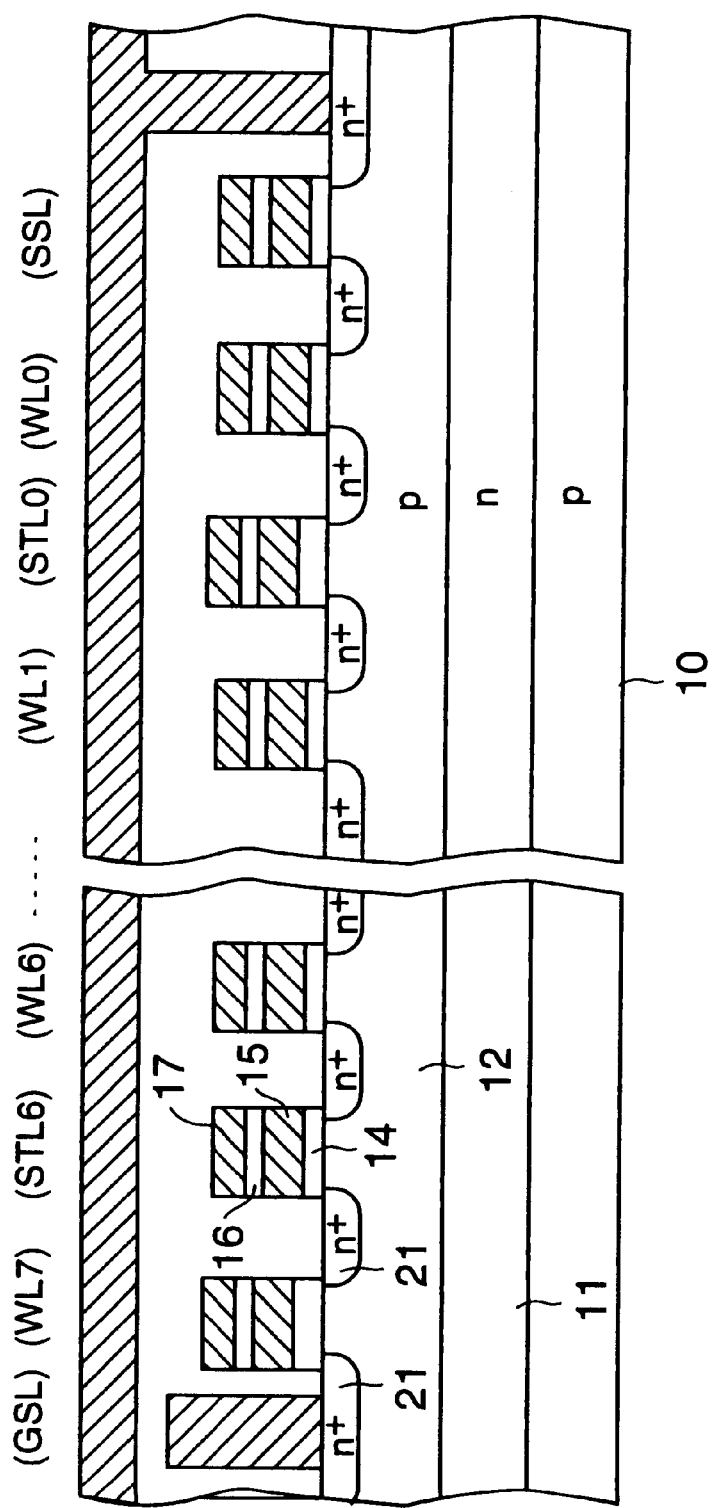
FIG. 21 is a sectional view of the memory cell array in the fourth preferred embodiment, which is taken along line A–A' of FIG. 19.

Before describing other preferred embodiments of the present invention, there is considered an example wherein the block dividing selecting transistors ST0 through ST6 have the same structure as that of the memory cells MC0 through MC7 in the fourth preferred embodiment shown in FIG. 15. The layout of this example is shown in FIG. 20, and a cross section taken along line A–A' of FIG. 20 is shown in FIG. 21.

Figure 22:
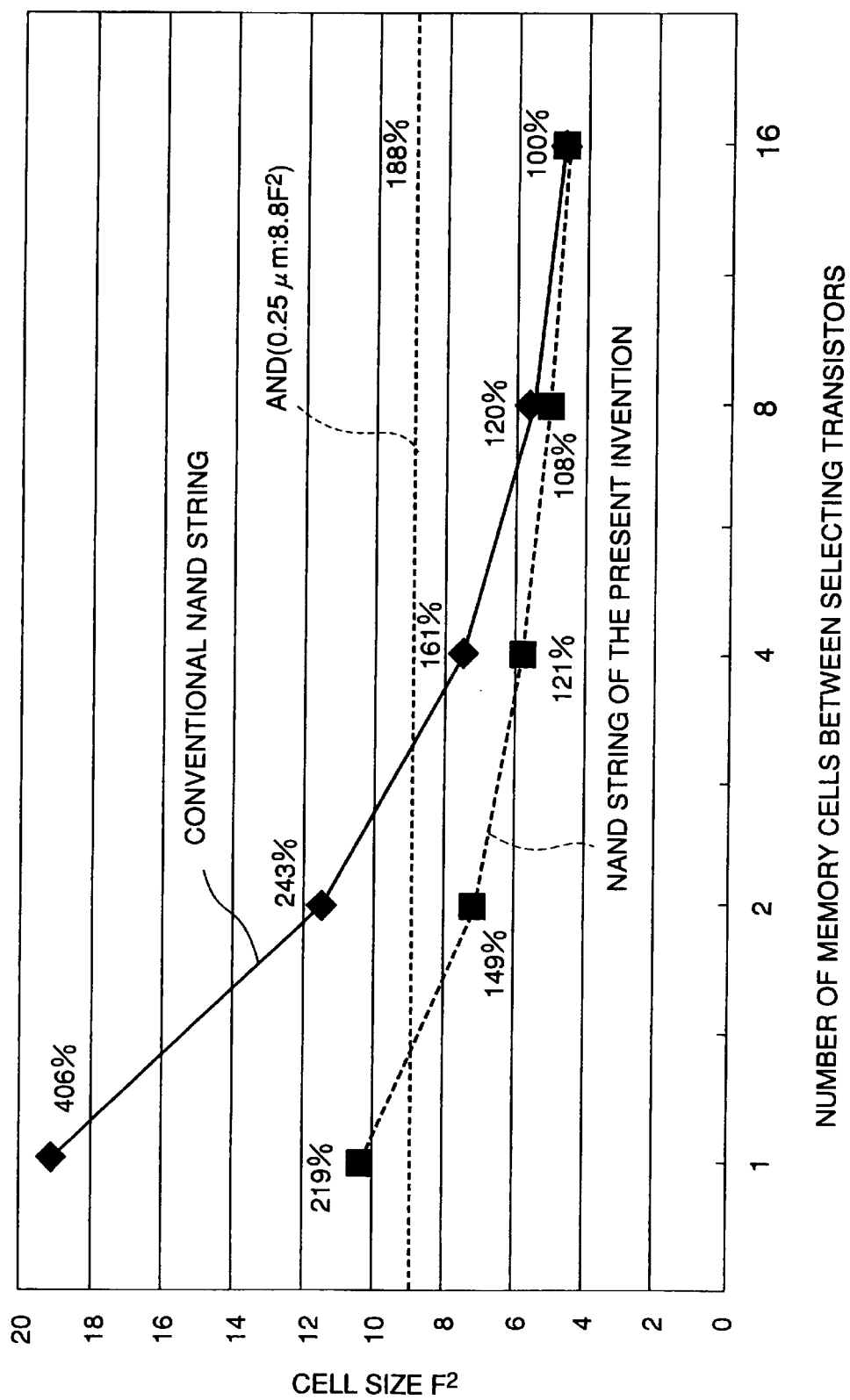
FIG. 22 is a graph showing the relationship between the number of memory cells between selecting transistors and the cell size.

In this case, the dependency of memory cell sizes on the number of memory cells between block dividing selecting transistors is shown in FIG. 22, wherein F denotes a feature size, i.e., a design rule. In this example, one memory cell unit comprises 16 memory cells.

In this example, by carrying out the block division using the block dividing selecting transistors, it is possible to realize memory cells of a far smaller area than a case where the number of memory cells between the selecting transistors is decreased in the conventional NAND cell string. For example, when the number of memory cells between selecting transistors or block dividing selecting transistors is 1, it is possible to realize about half the cell size of the conventional NAND cell string.

However, assuming that the cell size is 100 when the number of the memory cells between the selecting transistors is 16, when the number of the memory cells between the block dividing selecting transistors is 1, the cell size increases to 219 which is about two times (see FIG. 22).

Figure 23:
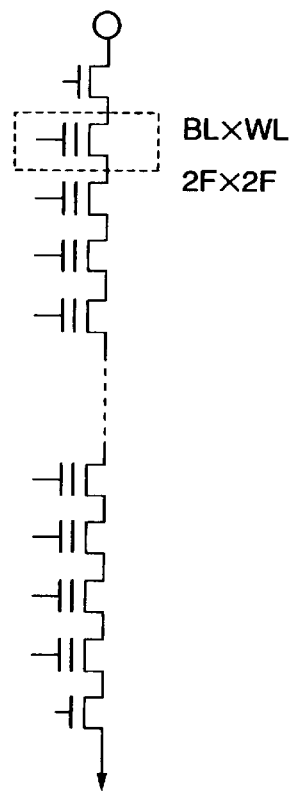
FIGS. 23(a), 23(b) and 23(c) are diagrams for explaining the sizes of the respective memory cells.
Figure 23:
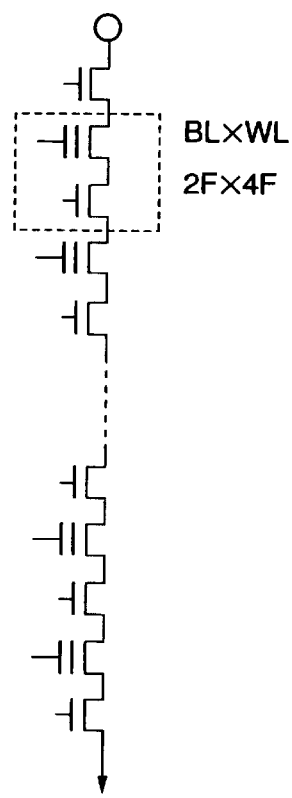
Figure 23:
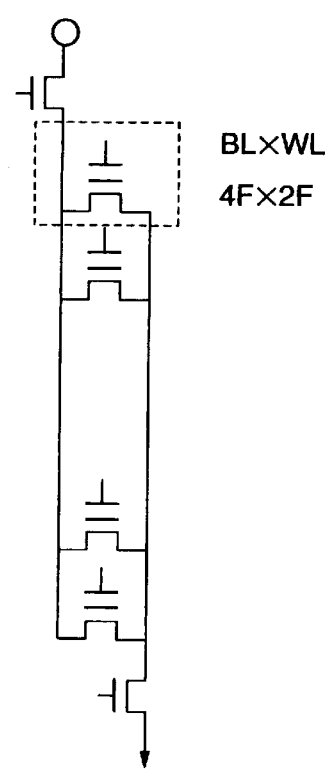
Figure 24:
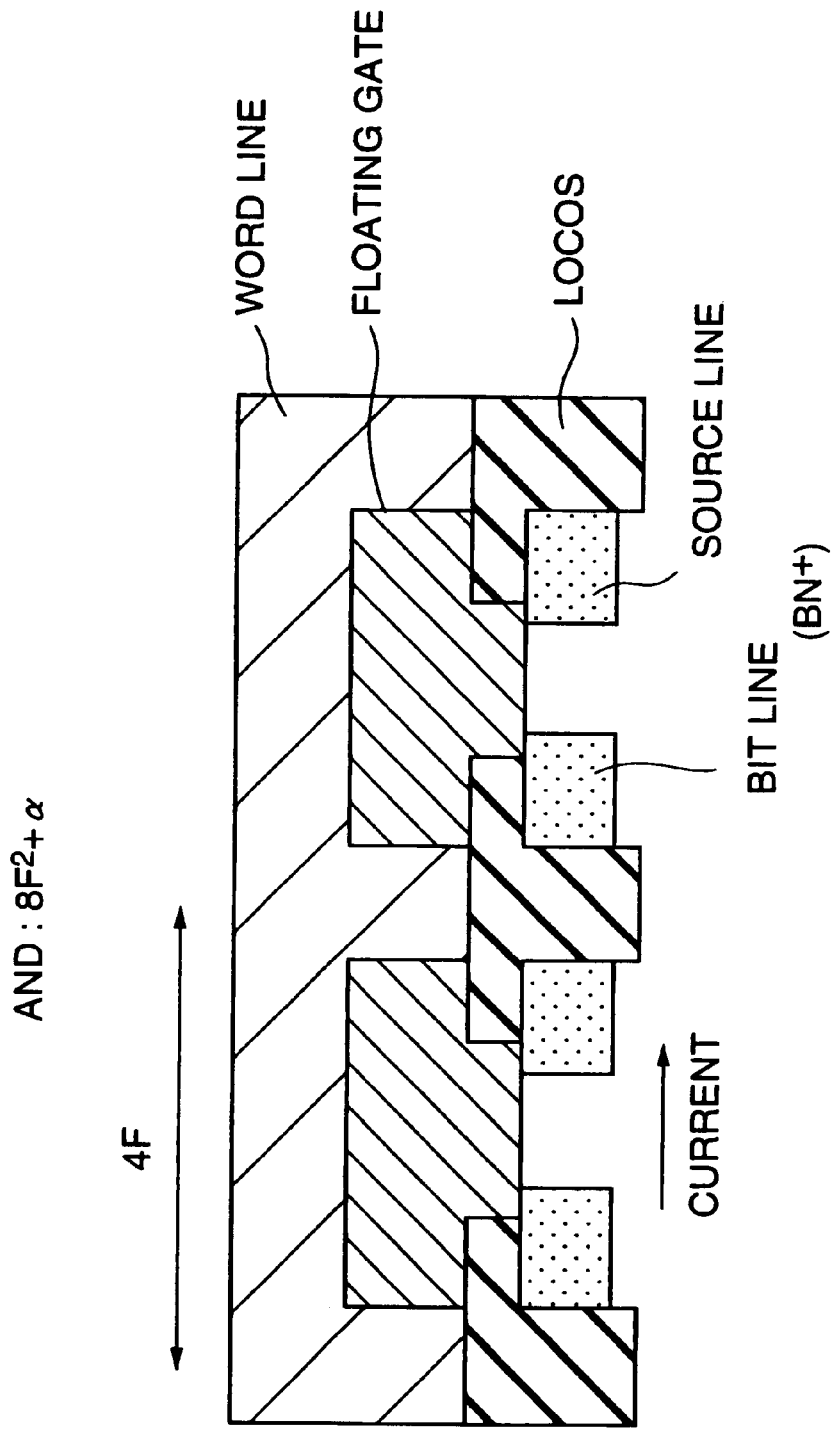
FIG. 24 is a sectional view of an AND type EEPROM.

Referring to FIGS. 23(a), 23(b) and 23(c), the reason for this will be described below. When the number of the memory cells between the selecting transistors in the conventional type, if the STI (Shallow Trench Isolation) is used for element isolation, the size of one memory cell can be substantially the cell size of the bit line pitch 2F× the word line pitch 2F=4F$^2$ (see FIG. 23(a)). However, according to the present invention, the NAND string is substantially equal to the bit line pitch 2F×the word line pitch 4F=8F$^2$ (see FIG. 23(b)). This is substantially the same memory size as that of the bit line pitch 4F×the word line pitch 2F=8F$^2$ of an AND type EEPROM shown in FIG. 23(c). Furthermore, the cross section of the AND type EEPROM is shown in FIG. 24.

Therefore, the seventh and eighth preferred embodiments of the present invention, wherein the memory size does not increase even if the number of memory cells between block dividing selecting transistors decreases, will be described below.

(Seventh Preferred Embodiment)

The seventh preferred embodiment of a NAND type EEPROM according to the present invention is designed to control read, erase and write operations as shown in FIGS. 25, 26 and 27 in the second preferred embodiment of a NAND type EEPROM according to the present invention which is shown in FIG. 11. A case where a word line WL19 is selected for read and write operations will be considered. The basic feature is that the gate voltages of block dividing selecting transistors are controlled so as to be always equal to each other for the respective cases.

That is, during a read operation, all of the voltages applied to selecting gate lines STL0, STL1 and STL2 are set at a voltage Vread (see FIG. 25).

In addition, during an erase operation, all of the selecting gate lines STL0, STL1 and STL2 are set to be in αx Vera floating (FIG. 25). Moreover, during a write operation, all of the voltages applied to the selecting gate lines STL0, STL1 and STL2 are set at the voltage Vread, and the voltage applied to a selecting gate line GSL is set at a voltage of Vss. Since the voltage of Vread is applied to the word lines WL24 through WL31 of an unselected block even if the voltage of Vread is applied to the selecting gate line STL2, a block dividing selecting transistor ST2 in a write inhibited NAND string is cut off.

Figure 28:
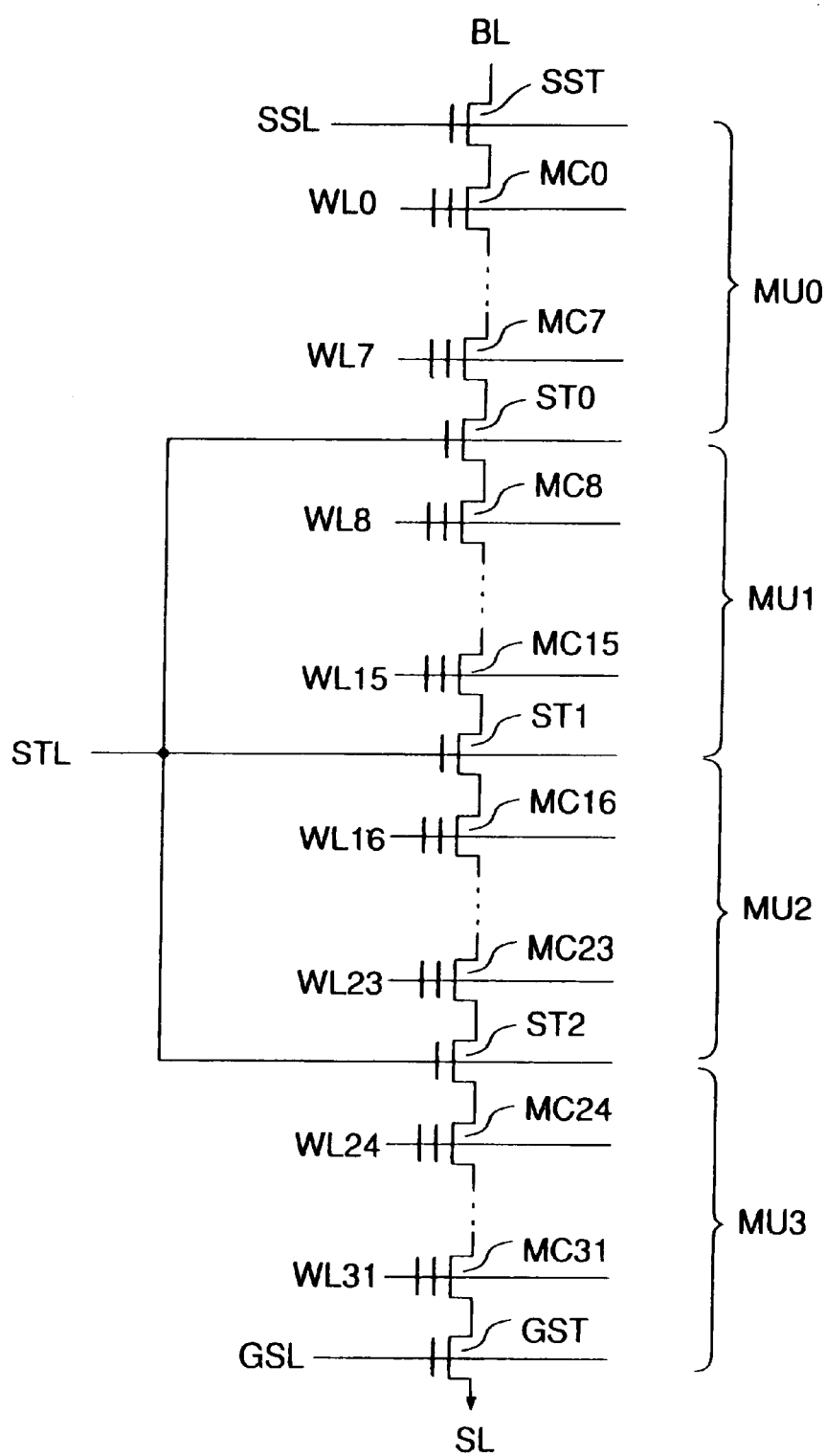
FIG. 28 is a diagram showing the seventh preferred embodiment of a memory cell array according to the present invention.

Therefore, in the seventh preferred embodiment, the NAND type EEPROM can have a common block dividing selecting gate line STL as shown in FIG. 28.

(Eighth Preferred Embodiment)

In the eighth preferred embodiment of the present invention, the conditions of voltages for read, erase and write operations are set as shown in FIGS. 29, 30 and 31 in the fourth preferred embodiment shown in FIG. 15. A case where a word line WL3 is selected for a write operation is shown.

Figure 32:
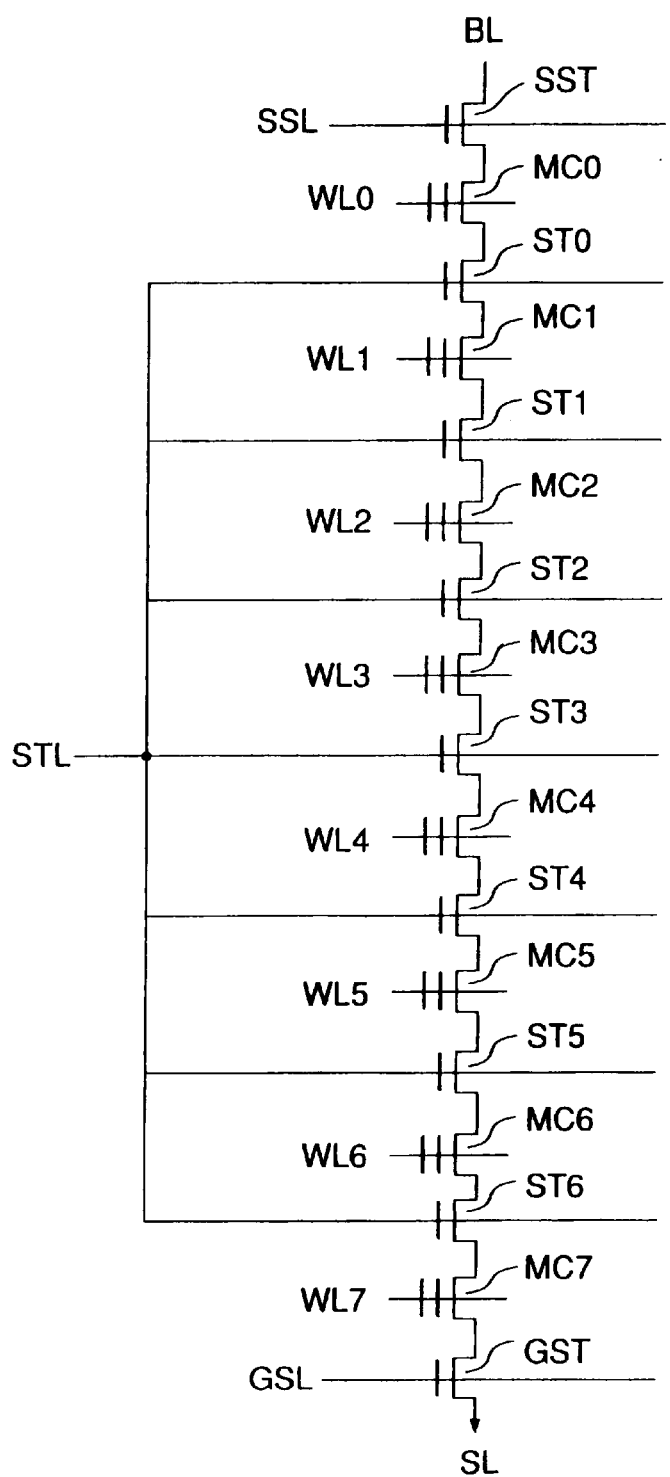
FIG. 32 is a diagram showing the eighth preferred embodiment of a memory cell array according to the present invention.
Figure 33:
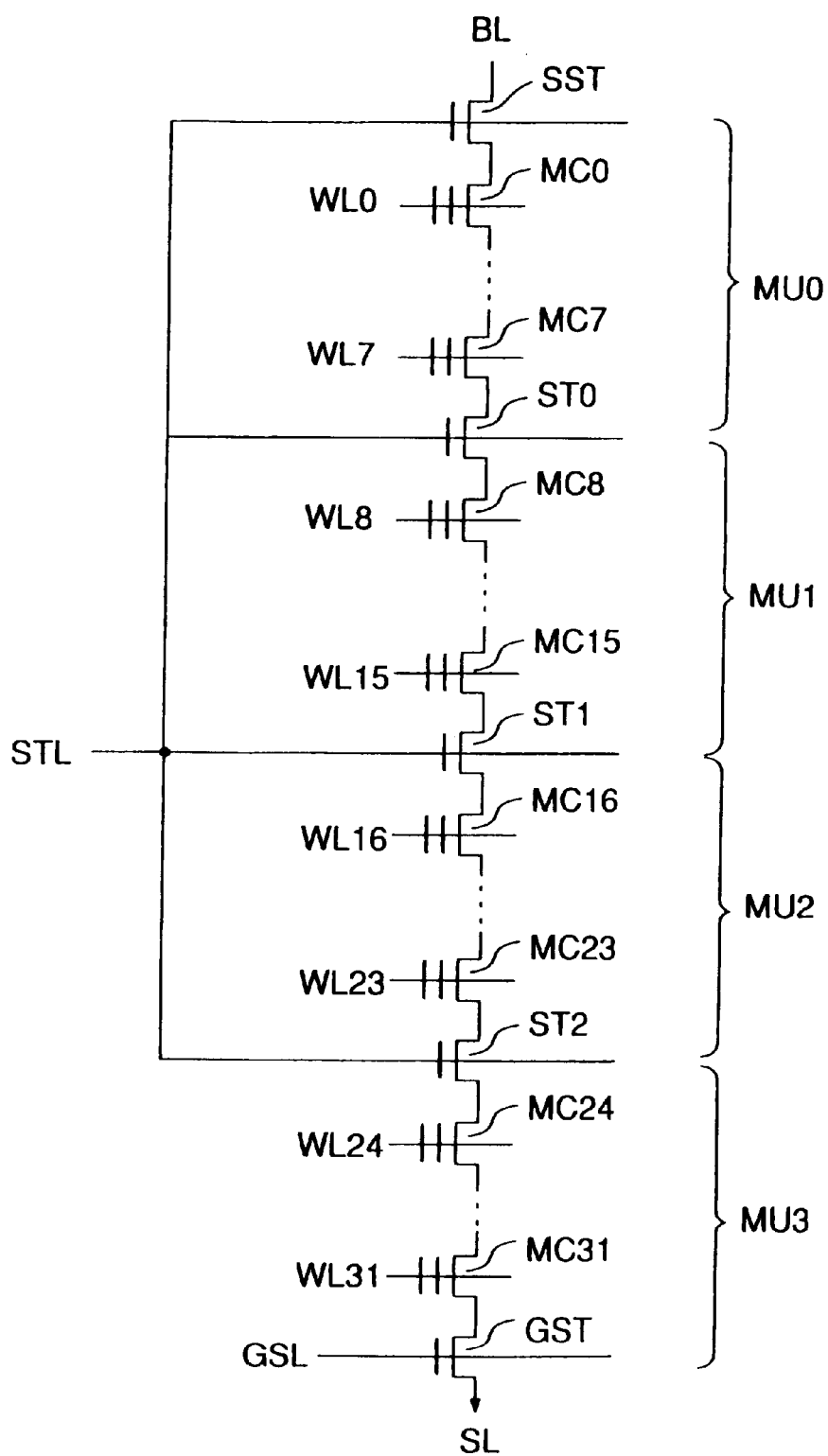
FIG. 33 is a diagram showing a modification of the seventh preferred embodiment of a memory cell array according to the present invention.
Figure 34:
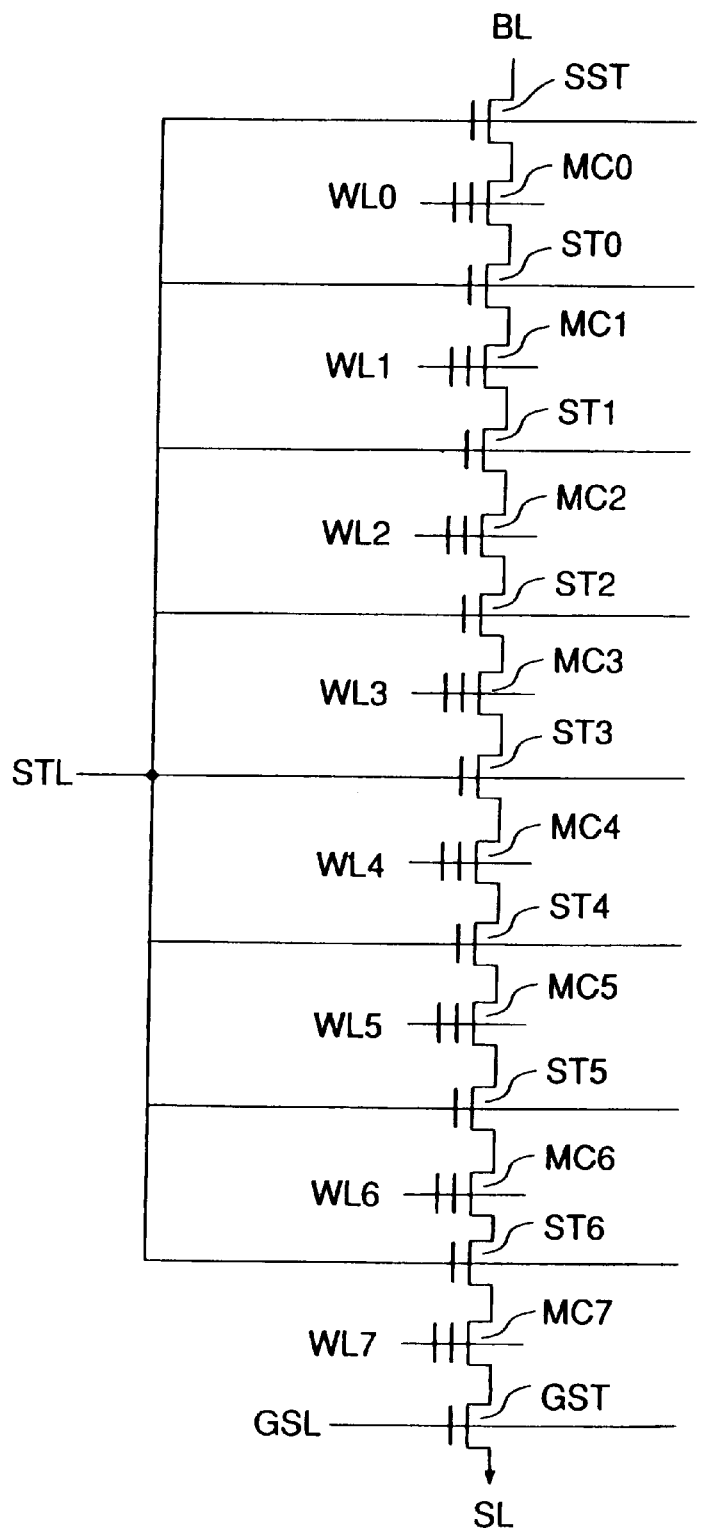
FIG. 34 is a diagram showing a modification of the eighth preferred embodiment of a memory cell array according to the present invention.

Therefore, similar to the seventh preferred embodiment, according to the eighth preferred embodiment, a common block dividing selecting gate line STL may be used as shown in FIG. 32. In addition, when the selecting gate line SSL on the bit line side is a common line, the seventh and eighth preferred embodiments may be effectively modified as shown in FIGS. 33 and 34. However, the voltage applied to the selecting gate GSL on the cell source side must be Vss during a write operation. This can not be common.

Furthermore, while all of the block dividing selecting gates have been common in the seventh and eighth preferred embodiment, at least two block dividing selecting gate lines may be commonly connected.

A method and process for producing a NAND type EEPROM according to the present invention will be described below. The booster plate technology has been recently proposed. The same process as this may be utilized for the producing method of the present invention.

First, a NAND type EEPROM, wherein a proposed booster plate of a conductive material is used to increase the channel potential of an unwritten NAND string and to decrease voltages for write/erase/read, will be described.

This NAND type EEPROM is disclosed in a literature (J. D. Choi et al., "A Novel Booster Plate Technology in High Density NAND Flash Memories for Voltage Scaling-Down and Zero Program Disturbance", in Symp. VLSI Technology Dig. Tech. Papers, June 1996, pp. 238–239).

Figure 35:
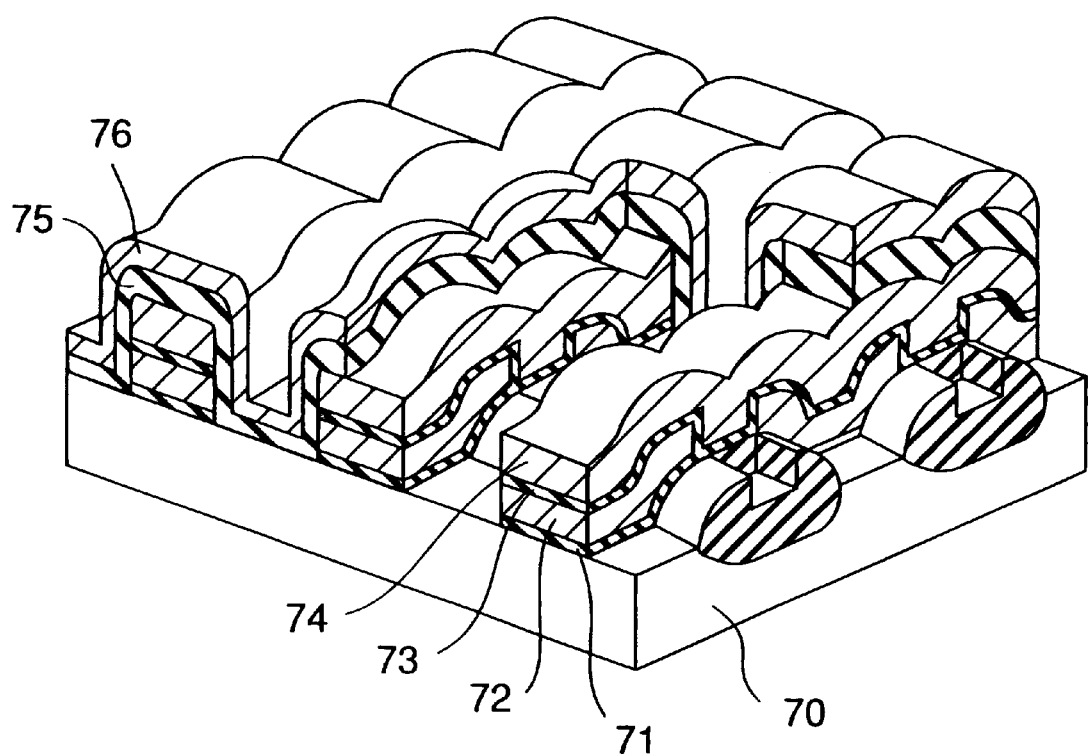
FIG. 35 is a perspective view of a NAND type EEPROM having a booster plate.

FIG. 35 is a perspective view of a NAND type EEPROM having a booster plate. The NAND type EEPROM has the following construction. As shown in FIG. 35, a floating gate 72 is formed on a substrate 70 via a gate insulator film 71, and a control gate 74 is formed on the floating gate 72 via an ONO film 73. A booster plate 76 is formed on the control gate 74 via a plate oxide film 75.

That is, the NAND type EEPROM of the above described literature is produced by depositing a CVD oxide film ($SiO_2$) serving as a plate oxide film 75 and a tungsten polycide (poly-Si and $WSi_x$) after preparing a conventional NAND type EEPROM, and thereafter, by patterning the polycide layer to form a booster plate 76 for covering all of memory cell transistors of each block.

Basically, the operation of the memory cell is substantially the same as that of the conventional NAND type EEPROM. However, to the booster plate 76, a write voltage is applied during a write operation, and 0 V is applied during an erase operation.

By the way, the booster plate has two advantages. One of the advantages is that a capacity coupling γis large during a write operation. In the conventional NAND type EEPROM having no booster plate, the capacity coupling γ is expressed by:

$$\gamma = Ccf/(Cfs+Ccf)$$

wherein Ccf is a capacity between the control gate (word line) 74 and the floating gate 72, and Cfs is a capacity between the floating gate 72 and the substrate 70. On the other hand, when the booster plate 76 is added, a capacity coupling ratio γb is expressed by:

$$\gamma b = (Ccf+Cbf)/(Ccf+Cbf)$$

wherein Cbf is a capacity between the booster plate 76 and the floating gate 72, and greater than γ in the case of the conventional NAND type EEPROM having no booster. Therefore, it is possible to lower the write voltage during a write operation.

In addition, since the capacity coupling ratio during an erase operation is expressed by (1−γb), it is possible to increase the potential difference between the substrate 70 and the floating gate 72, and it is possible to more rapidly carry out an erase operation than the conventional erase operation or to lower the erase voltage. In addition, the increase of γb can lower a voltage applied to a pass transistor during a read operation.

The other advantage is that the capacity coupling between the control gate (word line) 74 and the channel increases.

When the booster plate 76 is provided, the capacity coupling ratio Bb is expressed by:

$$Bb=(Cox+Cboot)/(Cox+Cboot+Cj)$$

wherein Cox is a sum of the gate capacities between the control gates (word lines) and the channels, Cboot is a sum of the gate capacities between the booster plates 76 and the channels, and Cj is a sum of the junction capacitances between the sources and drains of the cell transistors. Therefore, even if the voltage of the pass transistor is not excessively increased during awrite operation, it is possible to increase the channel potential of a write inhibited NAND string, and it is possible to improve margin for miswrite.

This booster plate may be utilized for the block dividing selecting gate lines.

A method for producing a NAND type EEPROM according to the present invention will be described below. FIGS. 36 through 50 show steps of producing a NAND type EEPROM according to the present invention. FIGS. 36, 39, 42, 45 and 48 are plan views showing steps of producing the NAND type EEPROM of the present invention. FIGS. 37, 40, 43, 46 and 49 are sectional views taken along line X–X' of the respective plan views, and FIGS. 38, 41, 44, 47 and 50 are sectional views taken along line Y–Y' of the respective plan views.

Figure 36:
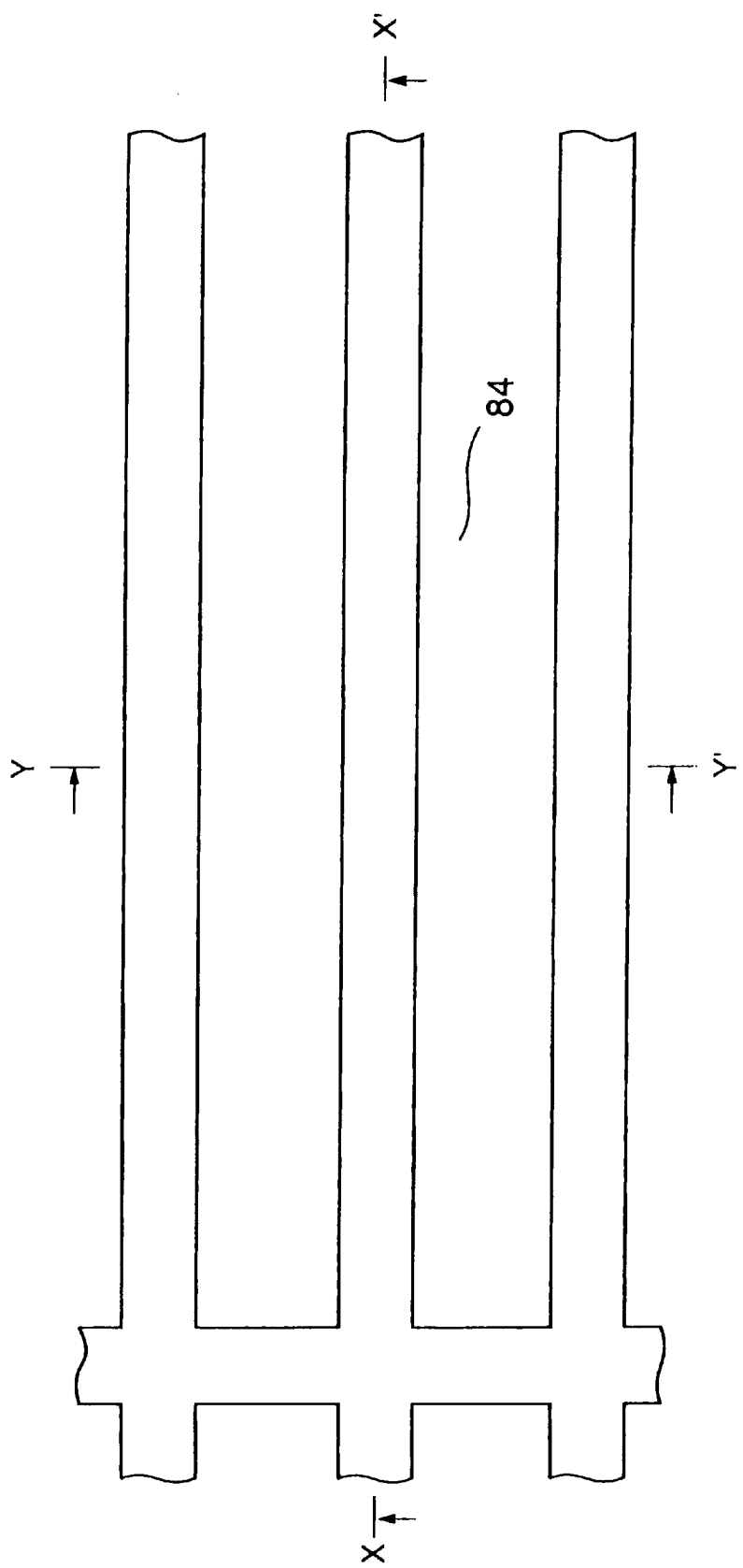
FIG. 36 is a plan view of a NAND type EEPROM in a producing process according to the present invention.
Figure 37:
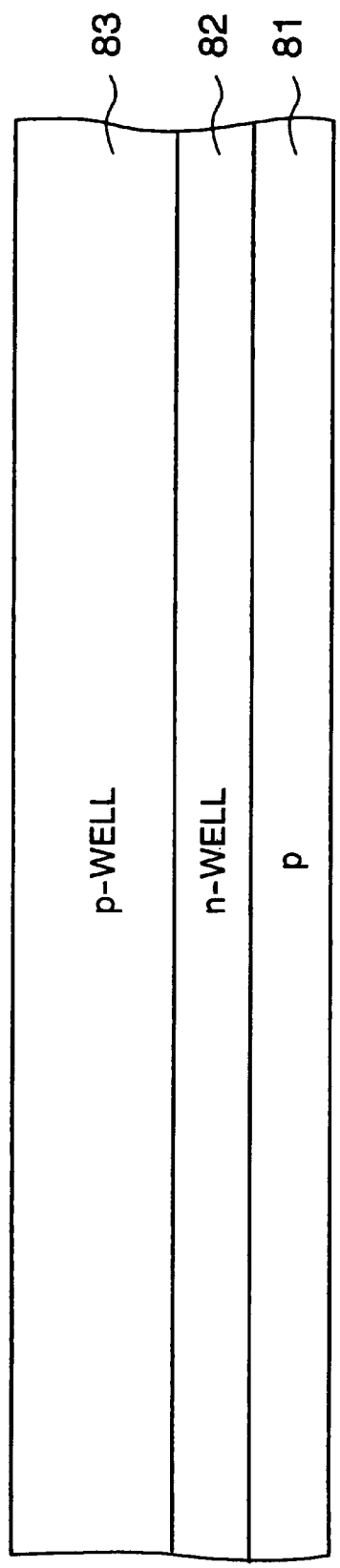
FIG. 37 is a sectional view taken along line X–X' of FIG. 36.
Figure 38:
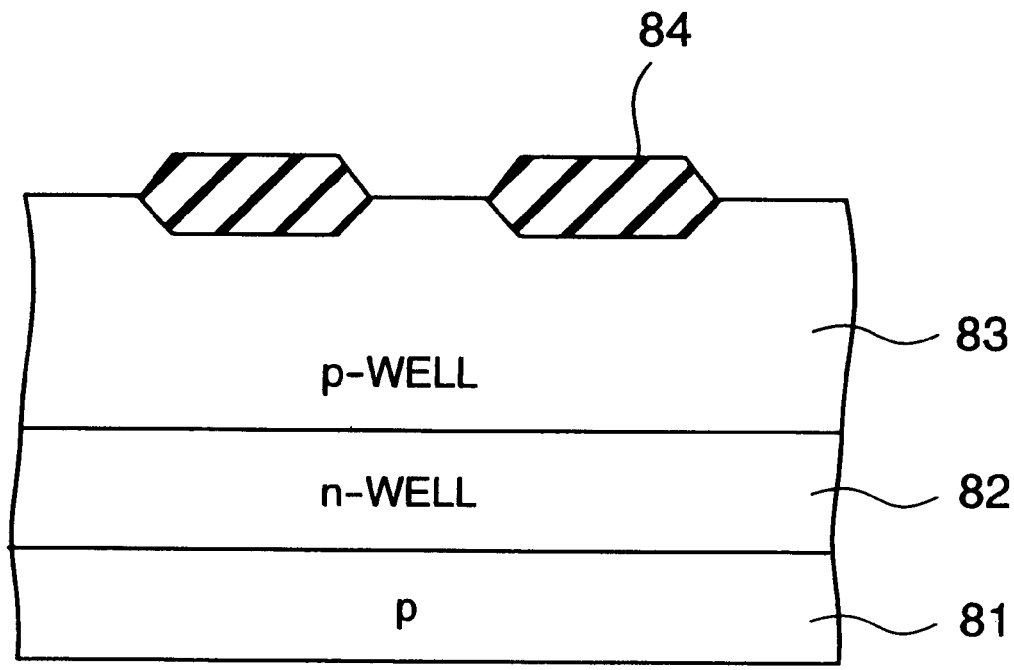
FIG. 38 is a sectional view taken along line Y–Y' of FIG. 36.

As shown in FIGS. 36 through 38, a memory cell n-well 82 is formed on a p-type silicon substrate 81, and a memory cell p-well 83 is formed in the memory cell n-well 82. On the memory cell p-well 83, a field oxide film (element isolating insulator film) 84 is formed. Then, a method for producing a NAND cell in a region surrounded by the field oxide film 84 will be described. The NAND cell herein comprises four memory cell transistors and two selecting gate transistors surrounding the memory cell transistors.

Figure 39:
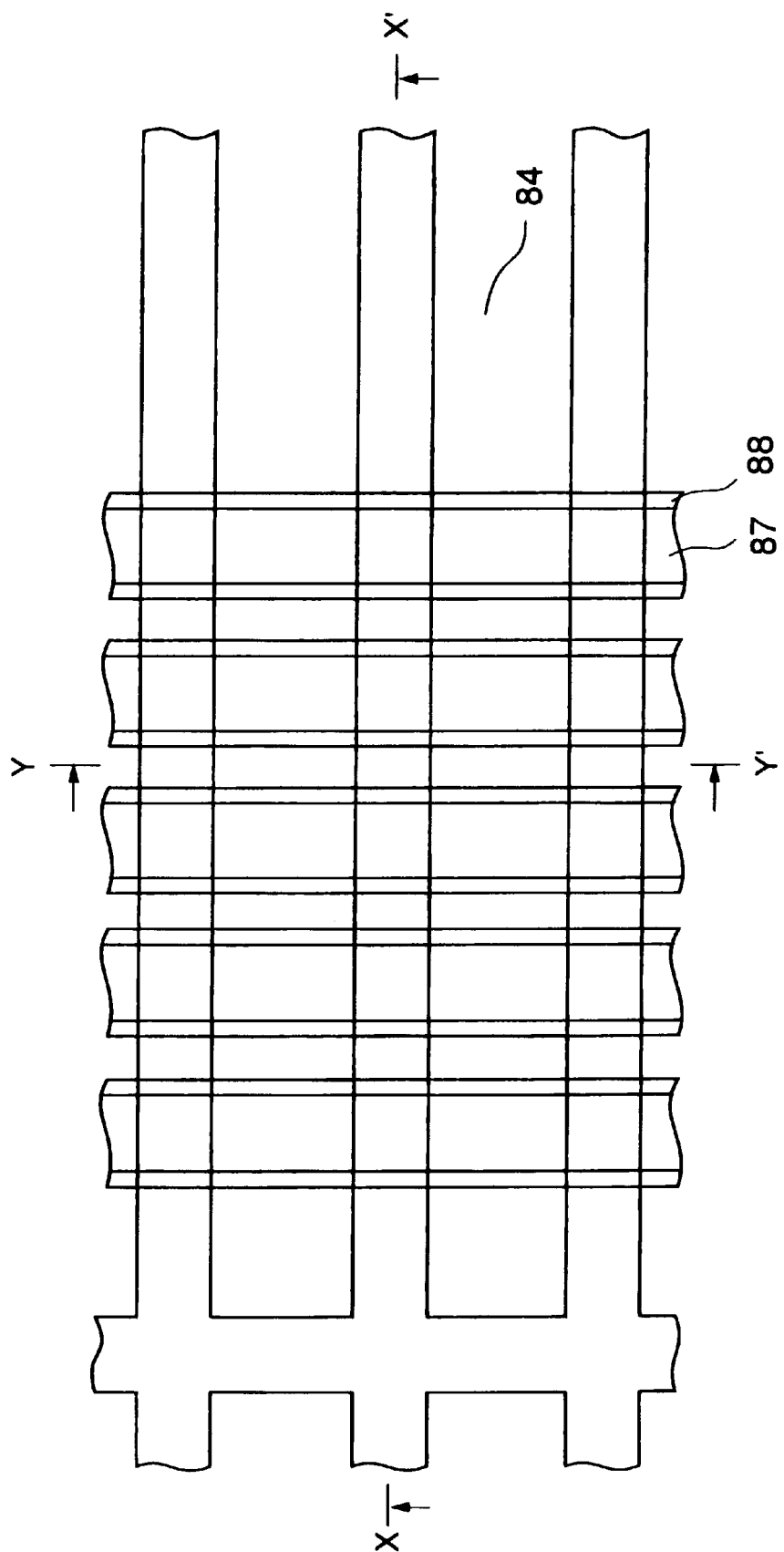
FIG. 39 is a plan view of a NAND type EEPROM in a producing process according to the present invention.
Figure 40:
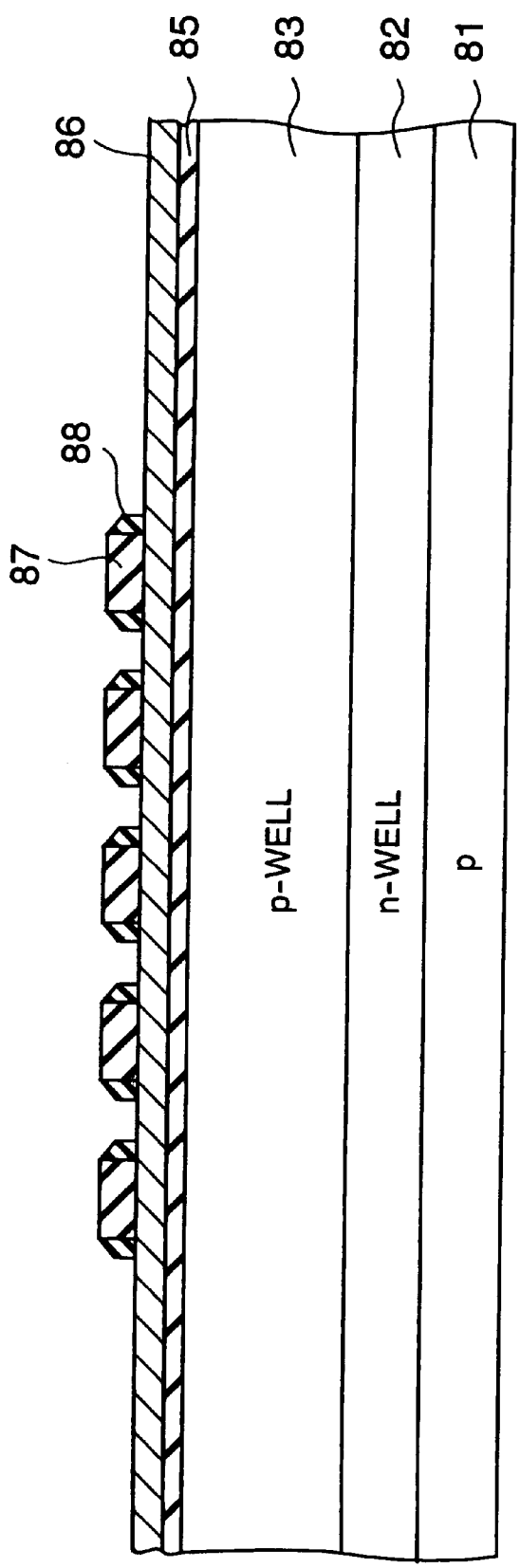
FIG. 40 is a sectional view taken along line X–X' of FIG. 39.
Figure 41:
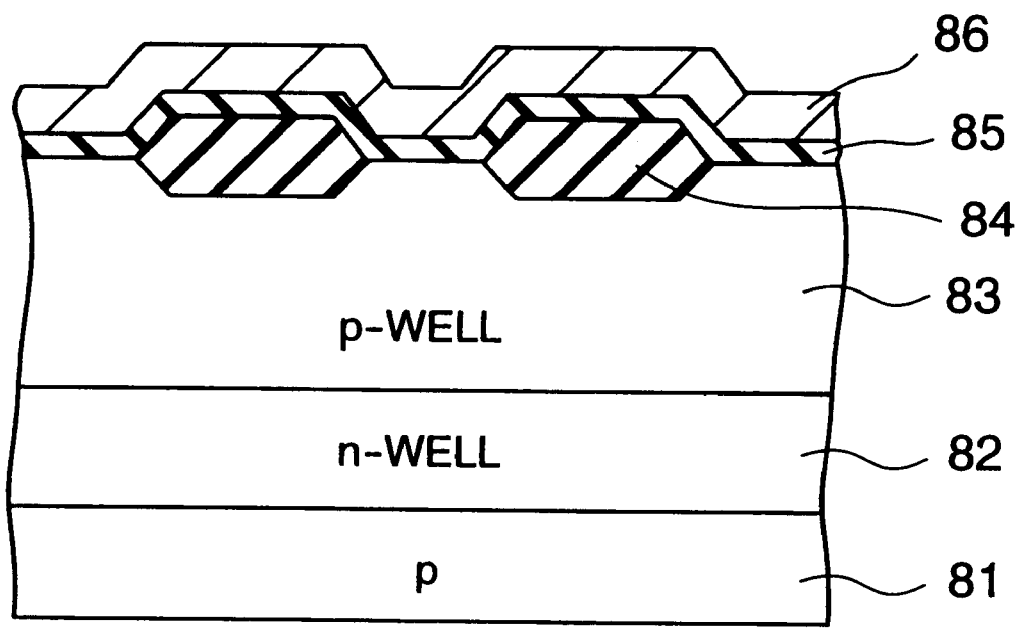
FIG. 41 is a sectional view taken along line Y–Y' of FIG. 39.

After the field oxide film 84 is formed on the memory cell p-well 83, a first gate insulator film 85 of a thermal oxide film having a thickness of 5 nm to 20 nm is deposited as shown in FIGS. 39 through 41. Moreover, a booster plate 86, which has a thickness of 1000 nm or more and which is made of a first polycrystalline silicon film, a laminated film of a silicide film and a polycrystalline silicon film, or a metal film, is deposited on the first gate insulator film 85.

Subsequently, as shown in FIG. 40, a silicon nitride film (SiN) 87 serving as a mask material is formed by the lithography method, and a side wall 88 is formed on the side of the silicon nitride film 87. Then, as shown in FIG. 43, the silicon nitride film 87 and the side wall 88 are used as masks to etch the first gate insulator film 85 and the booster plate 86 linearly in the direction of the control gate line.

Figure 42:
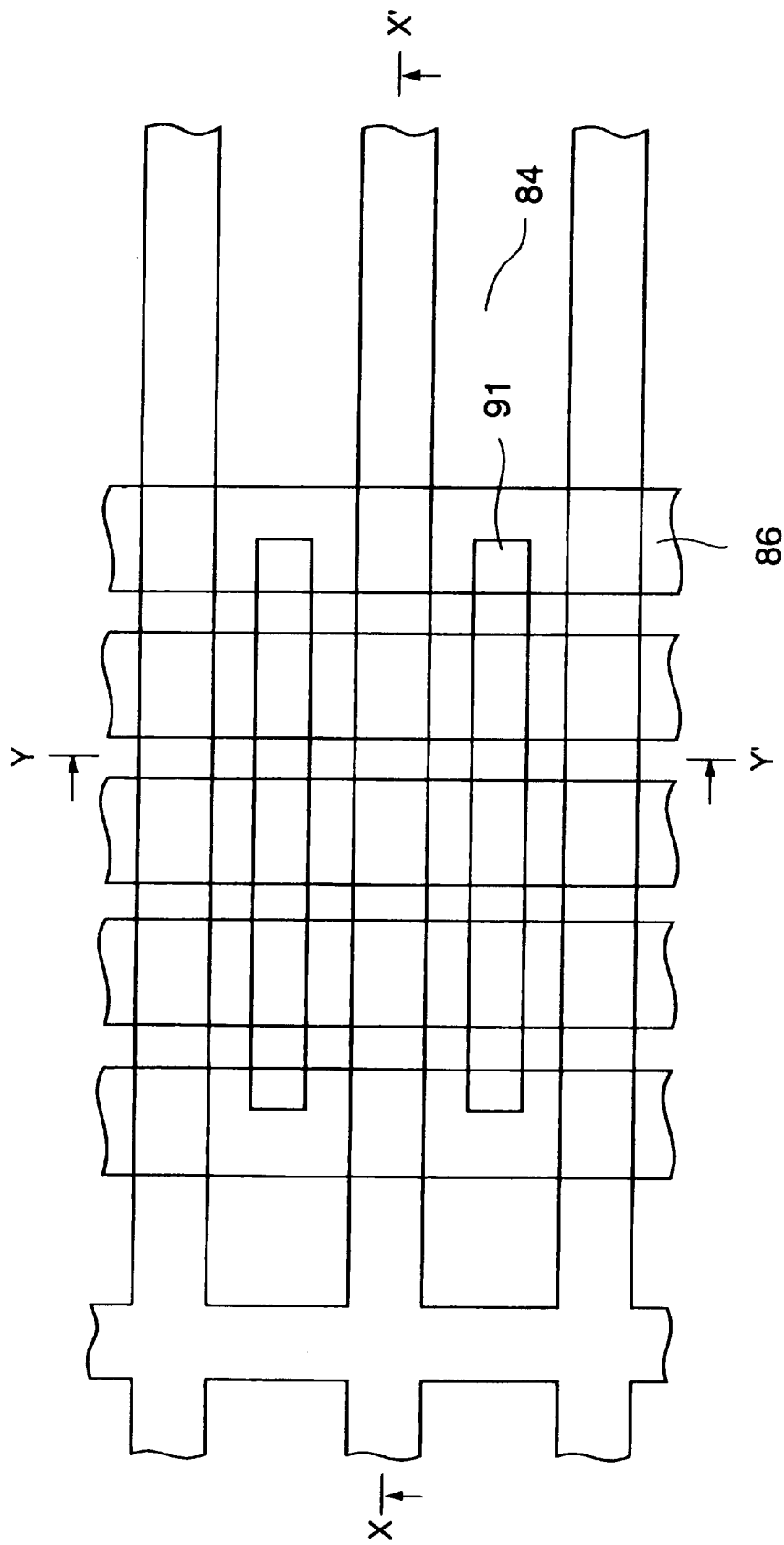
FIG. 42 is a plan view of a NAND type EEPROM in a producing process according to the present invention.
Figure 43:
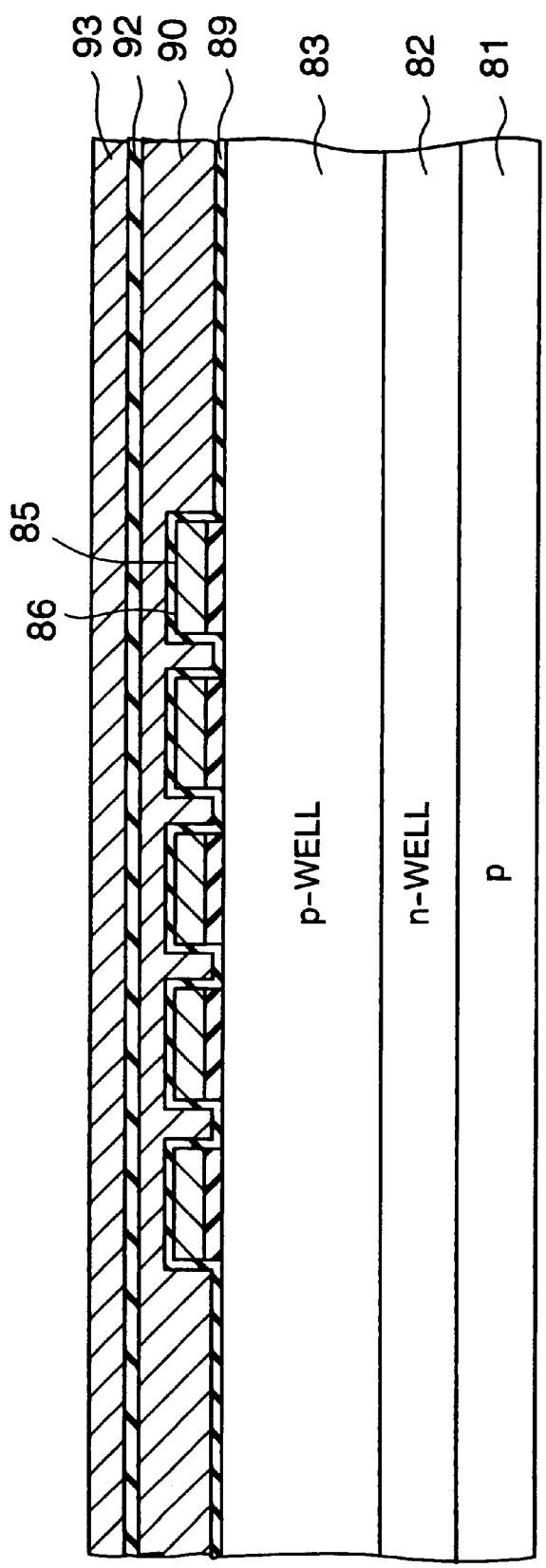
FIG. 43 is a sectional view taken along line X–X' of FIG. 42.
Figure 44:
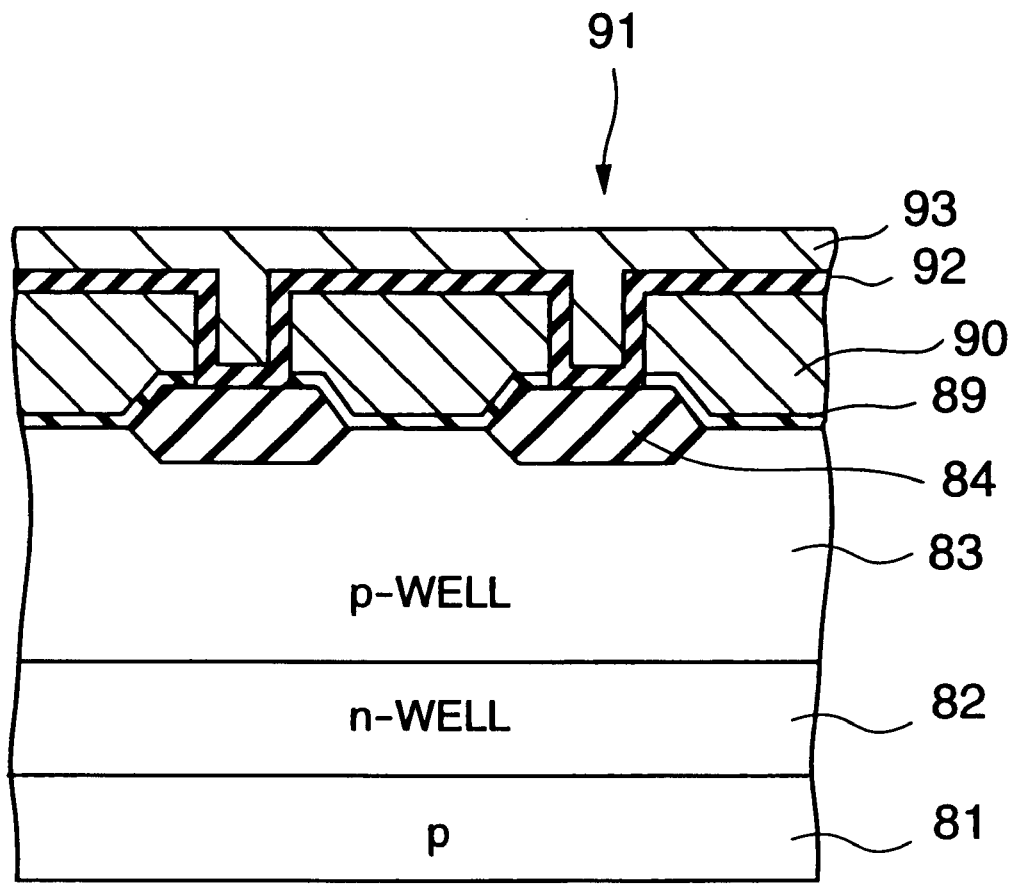
FIG. 44 is a sectional view taken along line Y–Y' of FIG. 42.

Then, as shown in FIGS. 42 through 44, a second gate insulator film 89 of a thermal oxide film having a thickness of 5 nm to 10 nm is deposited. On the second gate insulator film 89, a floating gate 90, which has a thickness of 1000 nm or more and which is made of a second polycrystalline silicon film, a laminated film of a silicide film and a polycrystalline silicon film, or a metal film, is deposited. Moreover, as shown in FIG. 44, a dividing groove 91 between the floating gates 90 is formed on the adjacent field oxide films 84 in the direction of the control gate line.

Thereafter, a third gate insulator film 92 having a thickness of 15 nm to 40 nm is formed on the floating gate 90. Moreover, a film 93, which has a thickness of 100 nm to 400 nm and which is made of a third polycrystalline silicon, a laminated film of a silicide film and a polycrystalline silicon film, or a metal, is deposited on the third gate insulator film 92.

Figure 45:
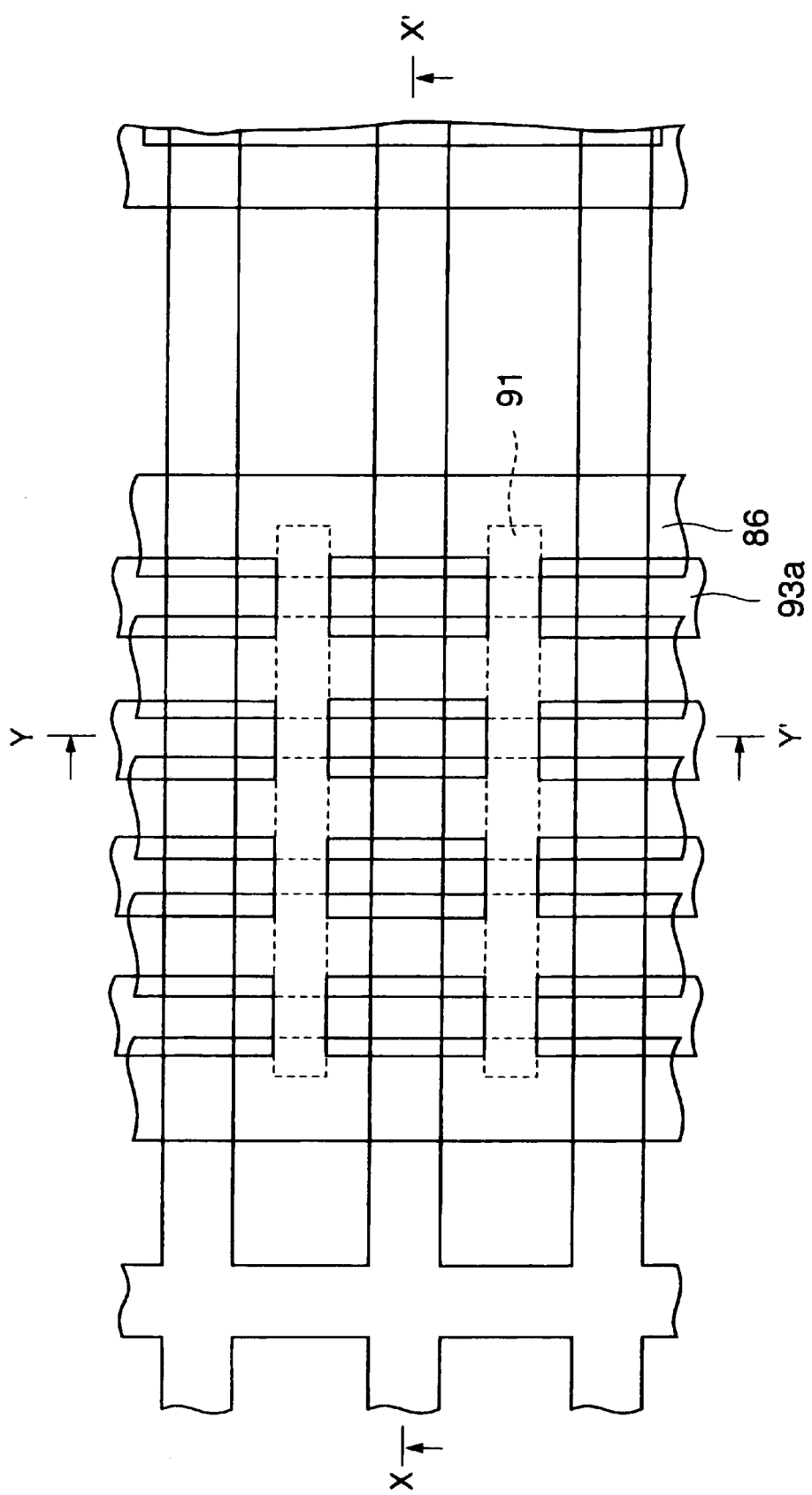
FIG. 45 is a plan view of a NAND type EEPROM in a producing process according to the present invention.
Figure 46:
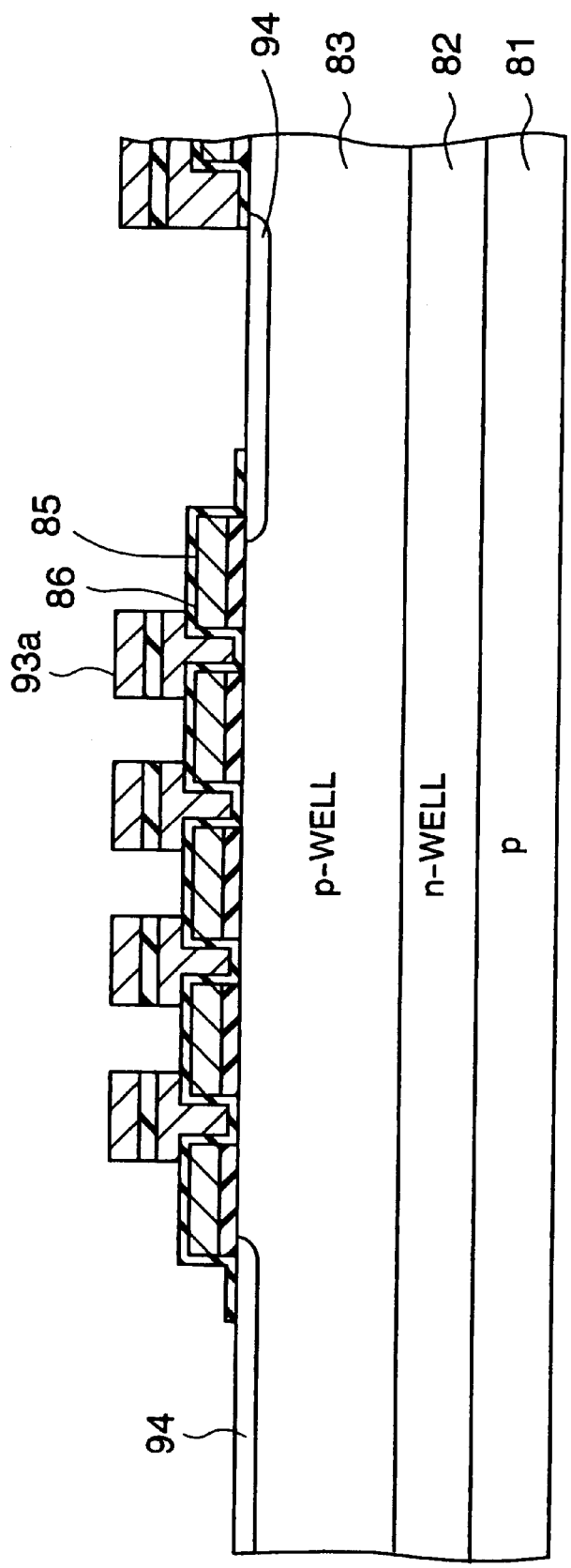
FIG. 46 is a sectional view taken along line X–X' of FIG. 45.
Figure 47:
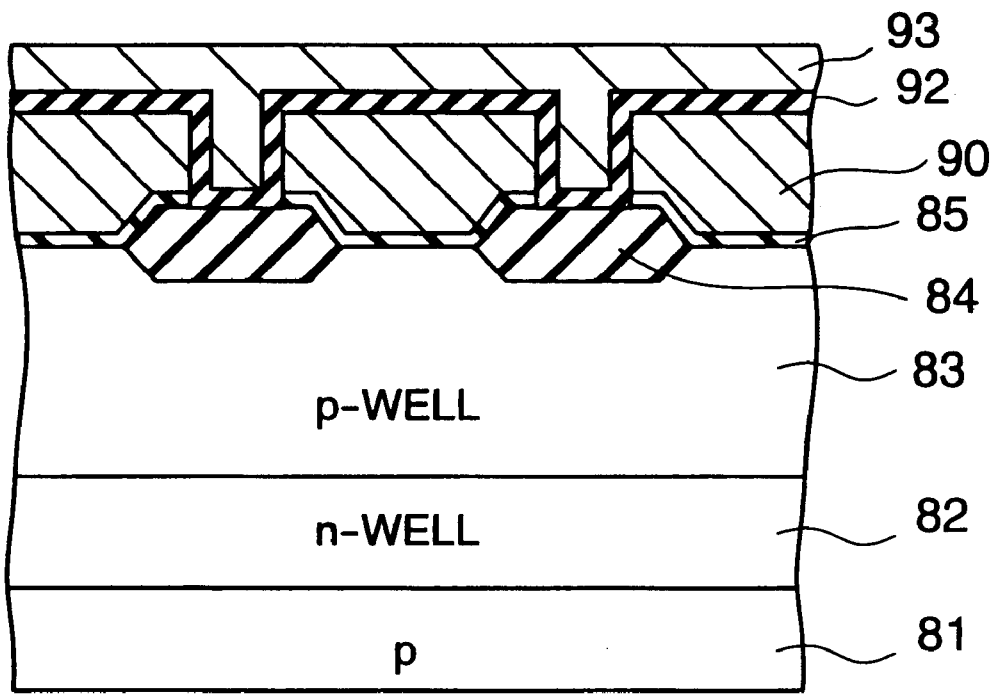
FIG. 47 is a sectional view taken along line Y–Y' of FIG. 45.

Then, as shown in FIGS. 45 through 47, the film 93 and the floating gate 90 are etched by the self alignment so as to remain between the adjacent booster plates 86 and on a part of the upper surface of the booster plates 86. Thus, aword line (control gate) 93, a selecting gate line 93a and a floating gate 90 are formed.

Thereafter, an N$^+$ layer 184 is formed in the drain and source parts of the NAND cell by the self alignment by the ion implantation. At this time, the N$^+$ layer is not formed in the drain/source region between the memory cell transistors of the NAND cell since the drain/source region is covered with the booster plate 86.

Figure 48:
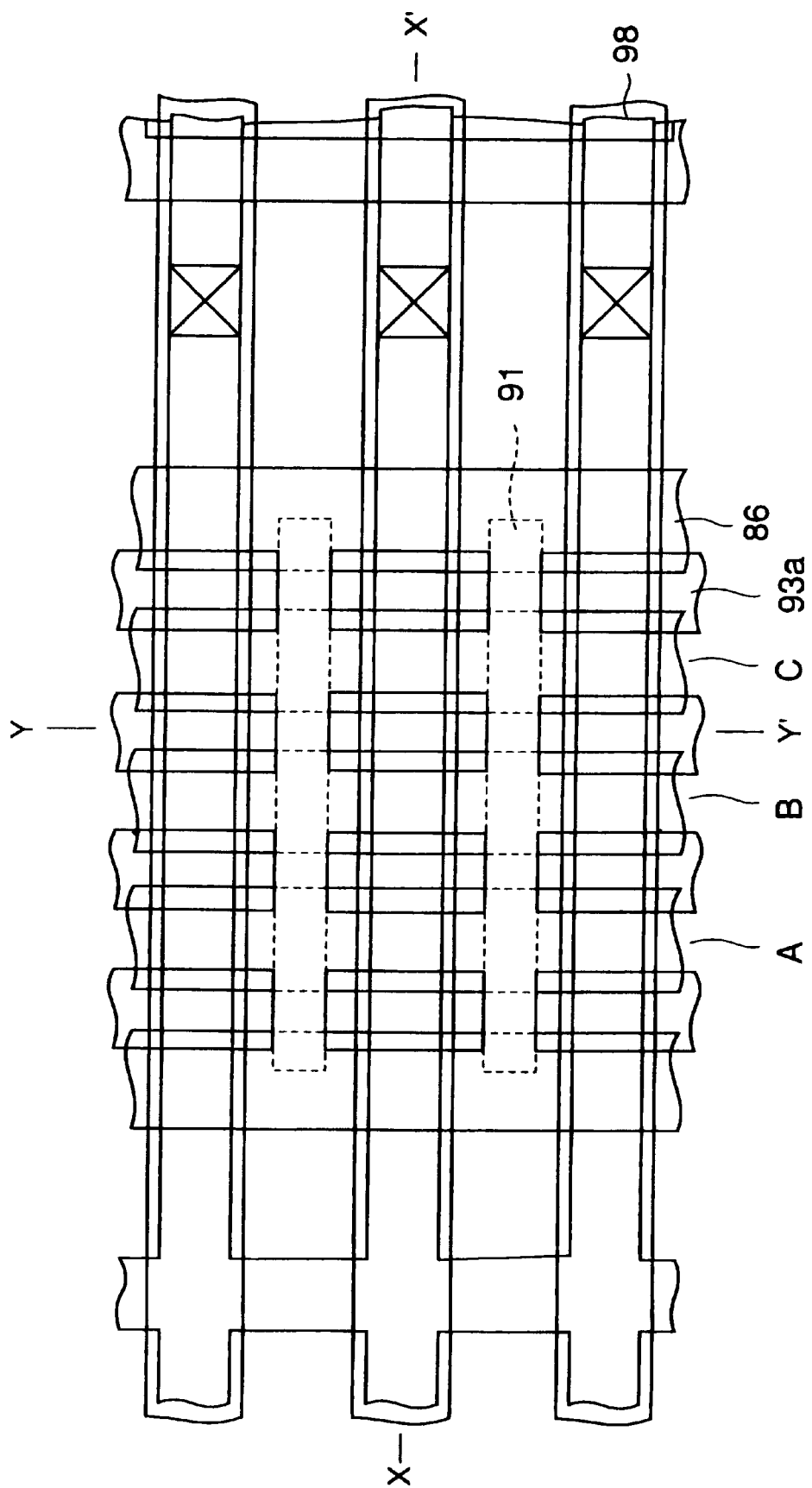
FIG. 48 is a plan view of a NAND type EEPROM in a producing process according to the present invention.
Figure 49:
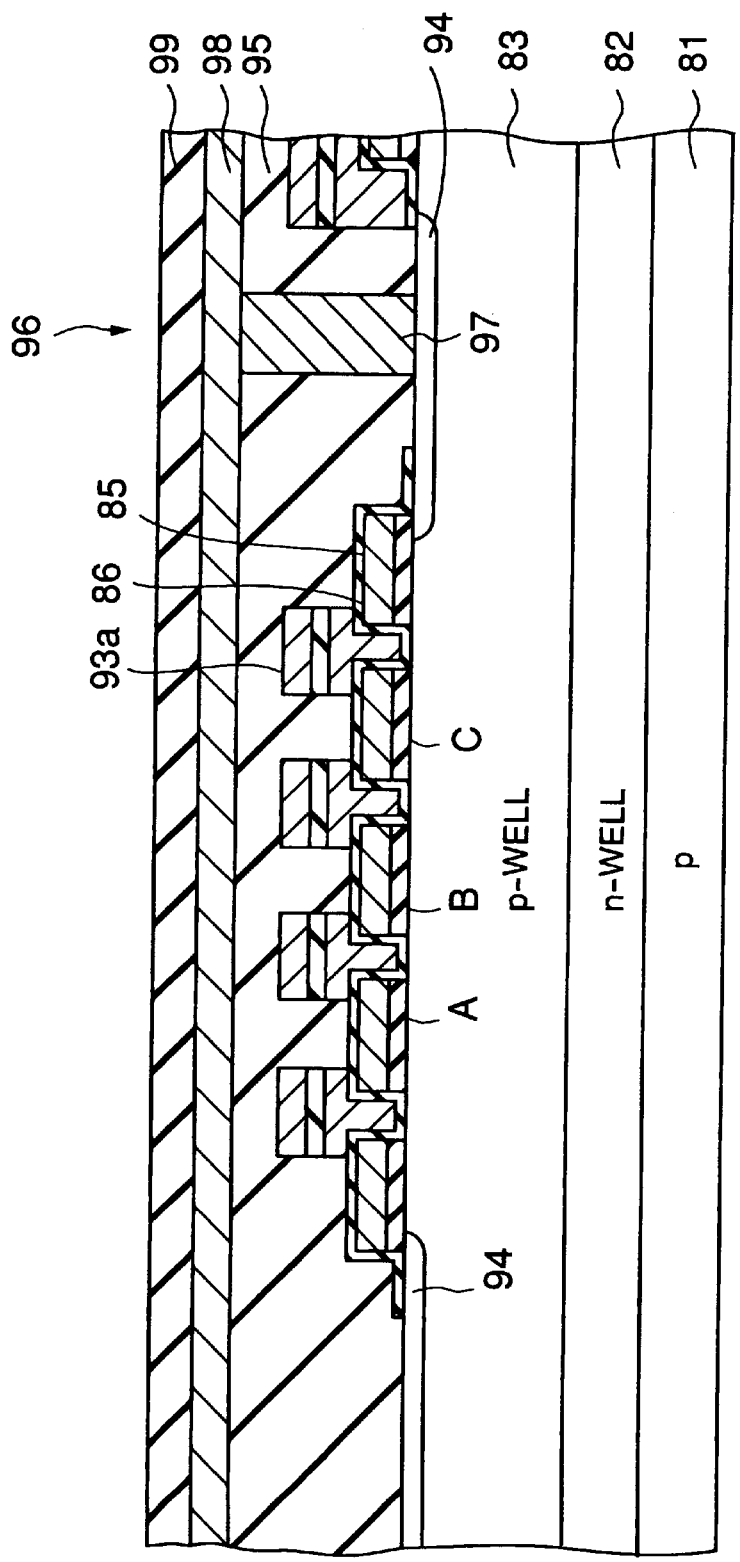
FIG. 49 is a sectional view taken along line X–X' of FIG. 48.
Figure 50:
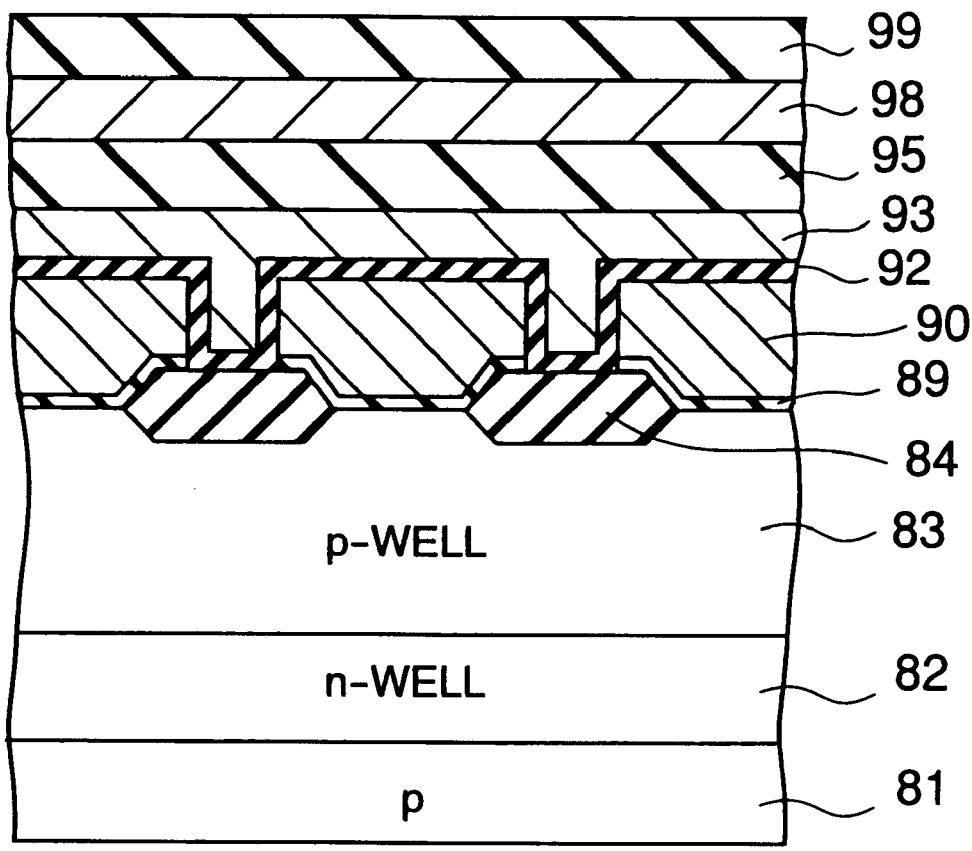
FIG. 50 is a sectional view taken along line Y–Y' of FIG. 48.

Then, as shown in FIGS. 48 through 50, a fourth insulator film 95 is deposited on the whole surface, and a contact hole 96 is formed in the fourth insulator film 95. Moreover, a tungsten plug 97 is embedded in the contact hole 96 to provide a bit line 98 of aluminum (Al) which is connected to the tungsten plug 97. Then, the whole surface is covered with a passivation film 99. By the above process, the NAND type EEPROM of the present invention is completed. Finally, the block dividing selecting gate lines shown by A, B and C in FIGS. 46 and 49 are connected by another wiring or the same wiring so as to be electrically common at the end of the memory array or sub-array.

As described above, according to the present invention, it is possible to provide a NAND type EEPROM which can set a plurality of erase blocks in a single NAND cell block and which can increase the number of memory cells in a single NAND string without increasing the erase block size.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A non-volatile semiconductor memory device comprising:
    a first signal line;
    a second signal line;
    a NAND cell comprising a plurality of electrically rewritable memory cells which are connected in series between said first and second signal lines; and
    a block dividing selecting transistor, provided between predetermined adjacent memory cells in said NAND cell, for dividing said NAND cell into a plurality of blocks,
    wherein at least one of said plurality of blocks is provided between said block dividing selecting transistor and said first signal lines and at least another one is provided between said block dividing selecting transistor and said second signal line.

2. A non-volatile semiconductor memory device as set forth in claim 1, wherein gates of at least two block dividing selecting transistors between said plurality of blocks are commonly connected.

3. A non-volatile semiconductor memory device as set forth in claim 2, wherein said first signal line is a bit line, and said second signal line is a cell source line.

4. A non-volatile semiconductor memory device as set forth in claim 2, wherein said memory cell is an electrically rewritable memory cell having a two-layer stacked structure, which has a floating gate and a control gate formed on said floating gate via an insulator film.

5. A non-volatile semiconductor memory device comprising:

a memory cell array including a plurality of NAND cells, each of said plurality of NAND cells comprising a plurality of electrically rewritable memory cells, which are selected by one of word lines and which are connected in series between a first signal line and a second signal line via a selecting transistor, respectively;

an address decoder for selecting one of said memory cells of said memory cell array in response to an address;

a sense amplifier circuit for sensing a read data from said memory cell array, said sense amplifier circuit having the ftinction of latching a write data to said memory cell array; and a control circuit for controlling data write, erase and read operations in and from said memory cell array, wherein said memory cell array is divided into a plurality of memory cell units by a block dividing selecting transistor provided between predetermined adjacent memory cells in each of said NAND cells, and at least one of said plurality of memory cell units is provided between said block dividing selecting transistor and said first signal line, and at least another one is provided between said block dividing selecting transistor and said second signal line.

6. A non-volatile semiconductor memory device as set forth in claim 5, wherein word line driving circuits in said address decoder are distributed on both ends of said memory cell array in a direction of said word lines every one or two of said memory cell units.

7. A non-volatile semiconductor memory device as set forth in claim 5, wherein said memory cell array is divided into $2^n$ (n: positive integer) memory cell units by $2^n-1$ block dividing selecting transistors provided between predetermined adjacent memory cells in each of said NAND cells.

8. A non-volatile semiconductor memory device as set forth in claim 7, wherein each of said memory cell units includes the same number of memory cells.

9. A non-volatile semiconductor memory device as set forth in claim 7, wherein each of said memory cell units includes a different number of memory cells.

10. A non-volatile semiconductor memory device as set forth in claim 5, wherein when data of said memory cell array are rewritten, one of said plurality of memory cell units is selected as an erase unit to carry out data erase, and data in a predetermined range of said memory cells along said word lines are written as data of one page.

11. A non-volatile semiconductor memory device as set forth in claim 10, wherein said data erase is carried out by:

applying a ground potential to all of the word lines of a selected one of said memory units;

setting all of the word lines of an unselected one of said memory cell units, and selecting gate lines, which are connected to the gates of the selecting transistors on the sides of said first and second signal lines and to the gate of said block dividing selecting transistor, to be in a floating state; and applying an erase voltage to a substrate region, in which said memory cell array is formed.

12. A non-volatile semiconductor memory device as set forth in claim 10, wherein said data write is carried out by:

applying a ground potential and a power supply potential to said first signal line in accordance with data "0" and "1" to be written, respectively;

applying a pass voltage, which causes said memory cells to conduct, to an unselected one of said word lines in a selected one of said memory cell units;

applying a read voltage, which is lower than said pass voltage for causing said memory cells to conduct, to all of said word lines of an unselected one of said memory cell units and to a selecting gate line connected to the gate of said block dividing selecting transistor between said unselected one of said memory cell units and said selected one of said memory cell units; and applying a write voltage, which is higher than said pass voltage, to a selecting word line of said selected one of said memory units.

13. A non-volatile semiconductor memory device comprising:

a memory cell array including a plurality of memory cell units, into which a NAND cell block is divided by a block dividing selecting transistor provided between predetermined adjacent memory cells of each of a plurality of NAND cells, each of said plurality of NAND cells comprising a plurality of electrically rewritable memory cells, each of which is selected by a different one of said word lines and which are connected to a bit line in series, said plurality of NAND cells being arranged so as to extend in directions of said word lines to constitute said NAND cell block;

an address decoder for select ing one of said memory cells of said memory cell array in response to an address;

a sense amplif ier circuit for sensing a read data from said memory cell array, said sense amplifier circuit having the function of latching a write data to said memory cell array; and data rewrite means for selecting one of said plurality of memory cell units as an erase unit to batch erase data in the selected one of said plurality of memory cell units and for writing data on one page corresponding to a predetermined range of said plurality of memory cells along one of said word lines.

14. A non-volatile semiconductor memory device comprising:

first and second signals lines;

first and second selecting transistors;

first through n-th ($n \leq 3$) NAND cell blocks, each of which comprises a plurality of electrically rewritable memory cells connected in series; and first through (n–1)-th block dividing selecting transistors, wherein said first selecting transistor is connected to said first signal line, said first NAND cell block being connected to said first selecting transistor, the i-th ($1 \leq i \leq n-1$) block dividing selecting transistor of said first through (n–1)-th block dividing selecting transistors being connected to the i-th NAND cell block of said first through n-th ($n \leq 3$) NAND cell blocks, the (i+1)-th ($1 \leq i \leq n-1$) NAND cell block of said first through n-th ($n \leq 3$) NAND cell blocks being connected to the i-th block dividing selecting transistor of said first through (n–1)-th block dividing selecting transistors, said second selecting transistor being connected to the n-th NAND cell block of said first through n-th ($n \leq 3$) NAND cell blocks, said second signal line is connected to said second selecting transistor, and gates of at least two block dividing selecting transistors of said first through n-th block dividing selecting transistors being commonly connected.

15. A non-volatile semiconductor memory device as set forth in claim 14, wherein gates of said first and second selecting transistors are made of a polycrystalline silicon, a laminated body of a polycrystalline silicon and a silicide, or a metal electrode, and wherein gates of said first through (n−1)-th block dividing selecting transistors are made of a polycrystalline silicon, a laminated body of a polycrystalline silicon and a silicide, or a metal electrode.

16. A non-volatile semiconductor memory device as set forth in claim 14, wherein voltages applied to gates of said first through (n−1)-th block dividing selecting transistors are controlled so as to be equal to each other.

17. A non-volatile semiconductor memory device as set forth in claim 16, wherein during a data write operation, a power supply voltage Vcc or a read voltage Vread higher than said power supply voltage Vcc is applied to the gates of said first selecting transistor and said first through (n−1)-th block dividing selecting transistors, and a ground voltage Vss is applied to the gate of said second selecting transistor.

18. A non-volatile semiconductor memory device as set forth in claim 14, wherein said first signal line is a bit line, and said second signal line is a cell source line.

19. A non-volatile semiconductor memory device as set forth in claim 14, wherein each of said memory cells is an electrically rewritable memory cell having a two-layer stacked structure, which has a flowing gate and a control gate formed on said floating gate via an insulator film.

20. A non-volatile semiconductor memory device comprising:

first and second signals lines;

first and second selecting transistors;

first through n-th memory cells, each of which is electrically rewritable; and first through (n−1)-th block dividing selecting transistors, wherein said first selecting transistor is connected to said first signal line, said first memory cell being connected to said first selecting transistor, the i-th ($1 \leq i \leq n-1$) block dividing selecting transistor of said first through (n−1)-th block dividing selecting transistors being connected to the i-th memory cell of said first through n-th memory cells, the (i+1)-th ($1 \leq i \leq n-1$) memory cell of said first through n-th memory cells being connected to the i-th block dividing selecting transistor of said first through (n−1)-th block dividing selecting transistors, said second selecting transistor being connected to the n-th memory cell of said first through n-th memory cells, said second signal line being connected to said second selecting transistor, and gates of at least two block dividing selecting transistors of said first through n-th block dividing selecting transistors being commonly connected.

21. A non-volatile semiconductor memory device as set forth in claim 20, wherein gates of said first and second selecting transistors are made of a polycrystalline silicon, a laminated body of a polycrystalline silicon and a silicide, or a metal electrode, and wherein gates of said first through (n−1)-th block dividing selecting transistors are made of a polycrystalline silicon, a laminated body of a polycrystalline silicon and a silicide, or a metal electrode.

22. A non-volatile semiconductor memory device as set forth in claim 21, wherein voltages applied to gates of said first through (n−1)-th block dividing selecting transistors are controlled so as to be equal to each other.

23. A non-volatile semiconductor memory device as set forth in claim 22, wherein during a data write operation, a power supply voltage Vcc or a read voltage Vread higher than said power supply voltage Vcc is applied to the gates of said first selecting transistor and said first through (n−1)-th block dividing selecting transistors, and a ground voltage Vss is applied to the gate of said second selecting transistor.

24. A non-volatile semiconductor memory device as set forth in claim 20, wherein said first signal line is a bit line, and said second signal line is a cell source line.

25. A non-volatile semiconductor memory device as set forth in claim 20, wherein each of said memory cells is an electrically rewritable memory cell having a two-layer stacked structure, which has a flowing gate and a control gate formed on said floating gate via an insulator film.

\* \* \* \* \*